(12) United States Patent
Matsumoto et al.

(10) Patent No.: US 11,515,856 B2
(45) Date of Patent: Nov. 29, 2022

(54) ACOUSTIC WAVE DEVICE, FRONT-END CIRCUIT, AND COMMUNICATION APPARATUS

(71) Applicant: Murata Manufacturing Co., Ltd., Nagaokakyo (JP)

(72) Inventors: Katsuya Matsumoto, Nagaokakyo (JP); Yasuyuki Ida, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 534 days.

(21) Appl. No.: 16/715,767

(22) Filed: Dec. 16, 2019

(65) Prior Publication Data

US 2020/0119712 A1  Apr. 16, 2020

Related U.S. Application Data

(63) Continuation of application No. PCT/JP2018/023496, filed on Jun. 20, 2018.

(30) Foreign Application Priority Data

Jun. 23, 2017 (JP) .............................. JP2017-123620

(51) Int. Cl.
  *H03H 9/02* (2006.01)
  *H01L 41/047* (2006.01)
  (Continued)

(52) U.S. Cl.
  CPC ..... *H03H 9/02905* (2013.01); *H01L 41/0477* (2013.01); *H01L 41/0533* (2013.01);
  (Continued)

(58) Field of Classification Search
  CPC ............ H01L 41/0477; H01L 41/0533; H03H 9/02992; H03H 9/058; H03H 9/25
  USPC ...... 310/313 R, 313 A, 313 B, 313 C, 313 D
  See application file for complete search history.

(56) References Cited

U.S. PATENT DOCUMENTS

2009/0201102 A1  8/2009 Oda
2015/0249438 A1* 9/2015 Hira ..................... H03H 9/1092
                                                    310/313 C
(Continued)

FOREIGN PATENT DOCUMENTS

JP  2001-102905 A  4/2001
JP  2003-258162 A  9/2003
(Continued)

OTHER PUBLICATIONS

Official Communication issued in International Patent Application No. PCT/JP2018/023496, dated Aug. 7, 2018.

*Primary Examiner* — Derek J Rosenau
(74) *Attorney, Agent, or Firm* — Keating & Bennett, LLP

(57) ABSTRACT

An acoustic wave device includes a functional electrode provided on a first main surface of an element substrate, extended wiring lines that are electrically connected to the functional electrode and that are adjacent to each other on a second main surface facing away from the first main surface, external terminals that are connected to the extended wiring lines, respectively, and that are provided on the second main surface, a first resin portion that seals the acoustic wave device, and a second resin portion that is provided at a position which is between the element substrate and the first resin portion and which is on the second main surface.

19 Claims, 15 Drawing Sheets

(51) Int. Cl.
*H01L 41/053* (2006.01)
*H01L 41/25* (2013.01)
*H01L 41/29* (2013.01)
*H03H 3/08* (2006.01)
*H03H 9/05* (2006.01)
*H03H 9/25* (2006.01)
*H03H 9/64* (2006.01)

(52) U.S. Cl.
CPC .............. *H01L 41/25* (2013.01); *H01L 41/29* (2013.01); *H03H 3/08* (2013.01); *H03H 9/02566* (2013.01); *H03H 9/02842* (2013.01); *H03H 9/02992* (2013.01); *H03H 9/058* (2013.01); *H03H 9/0542* (2013.01); *H03H 9/25* (2013.01); *H03H 9/64* (2013.01)

(56) References Cited

U.S. PATENT DOCUMENTS

2018/0013404 A1 1/2018 Kawasaki et al.
2018/0026603 A1 1/2018 Iwamoto

FOREIGN PATENT DOCUMENTS

| JP | 2007-134370 A | 5/2007 |
| JP | 2007-243915 A | 9/2007 |
| JP | 2015-053470 A | 3/2015 |
| WO | 2008/059674 A1 | 5/2008 |
| WO | 2016/189952 A1 | 12/2016 |
| WO | 2016/208287 A1 | 12/2016 |

\* cited by examiner

ACOUSTIC WAVE DEVICE, FRONT-END CIRCUIT, AND COMMUNICATION APPARATUS

CROSS REFERENCE TO RELATED APPLICATIONS

This application claims the benefit of priority to Japanese Patent Application No. 2017-123620 filed Jun. 23, 2017 and is a Continuation Application of PCT Application No. PCT/JP2018/023496 filed on Jun. 20, 2018. The entire contents of each application are hereby incorporated herein by reference.

BACKGROUND OF THE INVENTION

1. Field of the Invention

The present invention relates to an acoustic wave device including a sealing resin, and a front-end circuit and a communication apparatus that include the acoustic wave device.

2. Description of the Related Art

Acoustic wave devices have widely been used as band pass filters. As an example of the acoustic wave devices, Japanese Unexamined Patent Application Publication No. 2007-243915 describes an acoustic wave device including an element substrate, a functional electrode, extended wiring lines connected to the functional electrode and extended to a rear surface (mount surface) side of the element substrate, and external terminals connected to the extended wiring lines on the rear surface side. In this acoustic wave device, a protective layer made of a resin material is provided on the rear surface of the element substrate, and a sealing resin layer is further formed so as to cover the protective layer.

However, in the acoustic wave device described in Japanese Unexamined Patent Application Publication No. 2007-243915, an interface between the protective layer and the sealing resin layer is in contact with both the extended wiring lines adjacent to each other, and thus electrochemical migration may occur in which a metallic substance included in the extended wiring lines moves outward along the interface. The occurrence of electrochemical migration causes an issue that a metallic substance from one of the adjacent extended wiring lines reaches the other extended wiring line, resulting in a short circuit between the adjacent extended wiring lines.

SUMMARY OF THE INVENTION

Preferred embodiments of the present invention significantly reduce or prevent the occurrence of electrochemical migration in a metallic substance included in extended wiring lines in an acoustic wave device including a sealing resin.

An acoustic wave device according to a preferred embodiment of the present invention includes an element substrate that includes a first main surface and a second main surface facing away from each other and that at least partially has piezoelectricity; a functional electrode that is provided directly or indirectly on the first main surface of the element substrate; a first extended wiring line and a second extended wiring line that are provided directly or indirectly on the second main surface of the element substrate, that are electrically connected to the functional electrode, and that are adjacent to each other; a first external terminal that is electrically connected to the first extended wiring line and that is provided directly or indirectly on the second main surface of the element substrate; a second external terminal that is electrically connected to the second extended wiring line and that is provided directly or indirectly on the second main surface of the element substrate; a first resin portion that seals the acoustic wave device; and a second resin portion that is provided at least at a position which is between the element substrate and the first resin portion and which is on the second main surface. The second resin portion has a lower Young's modulus than the first resin portion, the first resin portion and the second resin portion are in contact with each other, and an interface at which the first resin portion and the second resin portion are in contact with each other is located closer to a mount substrate than the first extended wiring line and the second extended wiring line.

With this structure in which the interface between the first resin portion and the second resin portion is located closer to the mount substrate than the first extended wiring line and the second extended wiring line, the movement of the metallic substance included in the first extended wiring line and the second extended wiring line along the interface is able to be significantly reduced or prevented. Accordingly, the occurrence of electrochemical migration in the metallic substance included in the first extended wiring line and the second extended wiring line is able to be significantly reduced or prevented. In addition, because the second resin portion has a lower Young's modulus than the first resin portion, electrochemical migration at the interface between the element substrate and the second resin portion is able to be significantly reduced or prevented.

An acoustic wave device according to a preferred embodiment of the present invention includes an element substrate that includes a first main surface and a second main surface facing away from each other and that at least partially has piezoelectricity; a functional electrode that is provided on the first main surface of the element substrate; a first extended wiring line and a second extended wiring line that are provided on the second main surface of the element substrate, that are electrically connected to the functional electrode, and that are adjacent to each other; a first external terminal that is electrically connected to the first extended wiring line and that is provided directly or indirectly on the second main surface of the element substrate; a second external terminal that is electrically connected to the second extended wiring line and that is provided directly or indirectly on the second main surface of the element substrate; a first resin portion that seals the acoustic wave device; and a second resin portion that is provided at least at a position which is between the element substrate and the first resin portion and which is on the second main surface. The second resin portion has a lower filler content than the first resin portion, the first resin portion and the second resin portion are in contact with each other, and an interface at which the first resin portion and the second resin portion are in contact with each other is located closer to a mount substrate than the first extended wiring line and the second extended wiring line.

With this structure in which the interface between the first resin portion and the second resin portion is located closer to the mount substrate than the first extended wiring line and the second extended wiring line, the movement of the metallic substance included in the first extended wiring line and the second extended wiring line along the interface is able to be significantly reduced or prevented. Accordingly, the occurrence of electrochemical migration in the metallic substance included in the first extended wiring line and the second extended wiring line is able to be significantly reduced or prevented. In addition, because the second resin portion has a lower filler content than the first resin portion, electrochemical migration at the interface between the element substrate and the second resin portion is able to be significantly reduced or prevented.

The interface at which the first resin portion and the second resin portion are in contact with each other may be in contact with the first external terminal, the second external terminal, an insulating member, or a space.

With this structure in which the interface is in contact with the first external terminal, the second external terminal, the insulating member, or the space, it is possible to prevent the movement of the metallic substance included in the first extended wiring line and the second extended wiring line. Accordingly, the occurrence of electrochemical migration in the metallic substance included in the first extended wiring line and the second extended wiring line is able to be significantly reduced or prevented.

The first external terminal and the second external terminal may include a metallic material having a lower ionization tendency than a metallic material included in the first extended wiring line and the second extended wiring line.

With this structure in which the first external terminal and the second external terminal include a metallic material having a lower ionization tendency, it is possible to prevent the movement of the metallic substance included in the extended wiring lines by using the first external terminal and the second external terminal. Accordingly, the occurrence of electrochemical migration in the metallic substance included in the first extended wiring line and the second extended wiring line is able to be significantly reduced or prevented.

The first resin portion and the second resin portion may be provided between the first external terminal and the second external terminal.

With this structure, the occurrence of electrochemical migration at the interface between the first resin portion and the second resin portion provided between the first external terminal and the second external terminal is able to be significantly reduced or prevented.

The first extended wiring line and the second extended wiring line may include Cu, and the first external terminal and the second external terminal may include Sn.

In a case where the first extended wiring line and the second extended wiring line include Cu in which the movement of the metallic substance is likely to occur, it is possible to prevent the movement of the metallic substance by and the first external terminal and the second external terminal including Sn. Accordingly, the occurrence of electrochemical migration in the metallic substance included in the first extended wiring line and the second extended wiring line is able to be significantly reduced or prevented.

The first extended wiring line and the second extended wiring line may not be in contact with the first resin portion but may be in contact with the second resin portion.

With this structure in which the first extended wiring line and the second extended wiring line are not in contact with the first resin portion but are in contact with the second resin portion, electrochemical migration that is likely to occur at the interface between the element substrate and the sealing resin is able to be significantly reduced or prevented.

The functional electrode may include an IDT electrode.

With this structure, the occurrence of electrochemical migration in the metallic substance included in the first extended wiring line and the second extended wiring line connected to the IDT electrode is able to be significantly reduced or prevented.

The first extended wiring line and the second extended wiring line may extend from the first main surface to side surfaces and the second main surface, the side surfaces connecting the first main surface and the second main surface.

With this structure, heat generated at the first main surface of the element substrate can be transmitted and radiated to the second main surface via the side surfaces.

The acoustic wave device may further include a third resin portion that is provided at least between the first resin portion, and the first extended wiring line and the second extended wiring line that are provided on the side surfaces. The third resin portion may have a lower Young's modulus than the first resin portion.

With this structure in which the third resin portion has a lower Young's modulus than the first resin portion, a force to be added to the first extended wiring line and the second extended wiring line on the side surfaces is reduced even in a case where an external force is added to the acoustic wave device, and a break in the first extended wiring line and the second extended wiring line is able to be significantly reduced or prevented.

The acoustic wave device may further include a third resin portion that is provided at least between the first resin portion, and the first extended wiring line and the second extended wiring line that are provided on the side surfaces. The third resin portion may have a lower filler content than the first resin portion.

With this structure in which the third resin portion has a lower filler content than the first resin portion, a force to be added to the first extended wiring line and the second extended wiring line on the side surfaces is reduced even in a case where an external force is added to the acoustic wave device, and a break in the first extended wiring line and the second extended wiring line is able to be significantly reduced or prevented.

The third resin portion may be further provided around the functional electrode in a direction along the first main surface, and the acoustic wave device may further include a cover layer that is provided on the third resin portion to cover the functional electrode in a direction perpendicular or substantially perpendicular to the first main surface.

With this structure in which the third resin portion is provided along the side surfaces and the first main surface of the element substrate, the structure of the acoustic wave device can be simplified.

The element substrate may include at least a supporting substrate including a silicon material and a piezoelectric layer that is provided directly or indirectly on the supporting substrate, and the acoustic wave device may further include an insulating layer that is provided between the supporting substrate, and the first extended wiring line and the second extended wiring line.

With this structure in which the insulating layer is provided between the supporting substrate including a silicon material and the extended wiring lines, flowing of a leak current into the supporting substrate is able to be significantly reduced or prevented.

The element substrate may include at least a supporting substrate and a piezoelectric layer that is provided directly or indirectly on the supporting substrate. When the element substrate is viewed in a cross section from a direction perpendicular or substantially perpendicular to the first main surface, side surfaces of the piezoelectric layer may be located on inner sides of the side surfaces of the element substrate. The first extended wiring line and the second extended wiring line may extend from the first main surface to the side surfaces of the piezoelectric layer and the side surfaces of the element substrate.

With this structure, for example, in the case of manufacturing acoustic wave devices by cutting a mother substrate including a plurality of element substrates by using a dicing blade, it is possible to prevent the piezoelectric layer from being touched by the dicing blade and to significantly reduce or prevent cracking or interfacial delamination of the piezoelectric layer.

The element substrate may include a supporting substrate and a piezoelectric layer that is provided directly on the supporting substrate. The functional electrode may be provided on the piezoelectric layer. An acoustic velocity of a bulk wave that propagates through the supporting substrate may be higher than an acoustic velocity of an acoustic wave that propagates through the piezoelectric layer.

With this structure, an acoustic wave propagating from the piezoelectric layer can be reflected by an interface between the supporting substrate and the piezoelectric layer and can be returned to the piezoelectric layer. Accordingly, it is possible to efficiently confine the energy of the acoustic wave within the piezoelectric layer.

The element substrate may include a supporting substrate, a piezoelectric layer that is provided indirectly on the supporting substrate, and an intermediate layer that is provided between the supporting substrate and the piezoelectric layer. The functional electrode may be provided on the piezoelectric layer. An acoustic velocity of a bulk wave that propagates through the intermediate layer may be lower than an acoustic velocity of an acoustic wave that propagates through the piezoelectric layer. An acoustic velocity of a bulk wave that propagates through the supporting substrate may be higher than the acoustic velocity of the acoustic wave that propagates through the piezoelectric layer.

With this structure, an acoustic wave propagating from the piezoelectric layer to the intermediate layer can be reflected by an interface between the supporting substrate and the intermediate layer and can be returned to the piezoelectric layer. Accordingly, it is possible to efficiently confine the energy of the acoustic wave within the piezoelectric layer.

The element substrate may include a supporting substrate, a piezoelectric layer that is provided indirectly on the supporting substrate, and an intermediate layer that is provided between the supporting substrate and the piezoelectric layer. The functional electrode may be provided on the piezoelectric layer. The intermediate layer may include a low-acoustic-velocity film in which an acoustic velocity of a bulk wave that propagates therethrough is lower than an acoustic velocity of an acoustic wave that propagates through the piezoelectric layer, and a high-acoustic-velocity film in which an acoustic velocity of a bulk wave that propagates therethrough is higher than the acoustic velocity of the acoustic wave that propagates through the piezoelectric layer. The low-acoustic-velocity film may be provided between the piezoelectric layer and the supporting substrate. The high-acoustic-velocity film may be provided between the low-acoustic-velocity film and the supporting substrate.

With this structure, an acoustic wave propagating from the piezoelectric layer to the low-acoustic-velocity film can be reflected by an interface between the high-acoustic-velocity film and low-acoustic-velocity film and can be returned to the piezoelectric layer. Accordingly, it is possible to efficiently confine the energy of the acoustic wave within the piezoelectric layer.

A front-end circuit according to a preferred embodiment of the present invention includes an acoustic wave device according to a preferred embodiment of the present invention.

With this structure, it is possible to provide the front-end circuit including the acoustic wave device in which electrochemical migration in the metallic substance included in the first extended wiring line and the second extended wiring line is significantly reduced or prevented.

A communication apparatus according to a preferred embodiment of the present invention includes a front-end circuit according to a preferred embodiment of the present invention and a signal processing circuit that processes a high-frequency signal.

With this structure, it is possible to increase the reliability of the communication apparatus.

According to the preferred embodiments of the present invention, the occurrence of electrochemical migration in a metallic substance included in a first extended wiring line and a second extended wiring line in an acoustic wave device including a sealing resin is able to be significantly reduced or prevented.

The above and other elements, features, steps, characteristics and advantages of the preferred embodiments of the present invention will become more apparent from the following detailed description of the preferred embodiments with reference to the attached drawings.

DETAILED DESCRIPTION OF THE PREFERRED EMBODIMENTS

Figure 1:
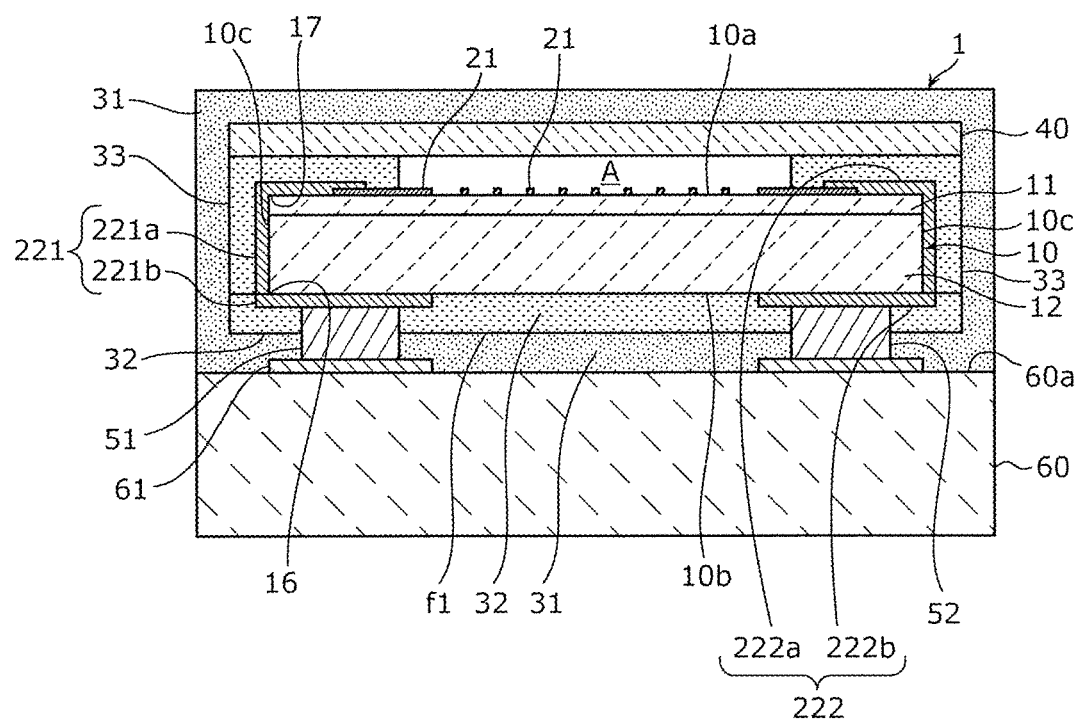
FIG. 1 is a cross-sectional view showing an example of an acoustic wave device according to a first preferred embodiment of the present invention.

Hereinafter, preferred embodiments of the present invention will be described in detail with reference to the drawings. Each of the preferred embodiments described below is a general or specific example. The values, shapes, materials, components, and the arrangement and connection of the components described in the following preferred embodiments are examples and are not intended to limit the present invention. Among the components in the following preferred embodiments, a component not described in a dependent claim will be described as an optional component. In addition, the sizes or size ratios of the components shown in the drawings are not necessarily accurate.

First Preferred Embodiment

1-1. Configuration of Acoustic Wave Device

Figure 2A:
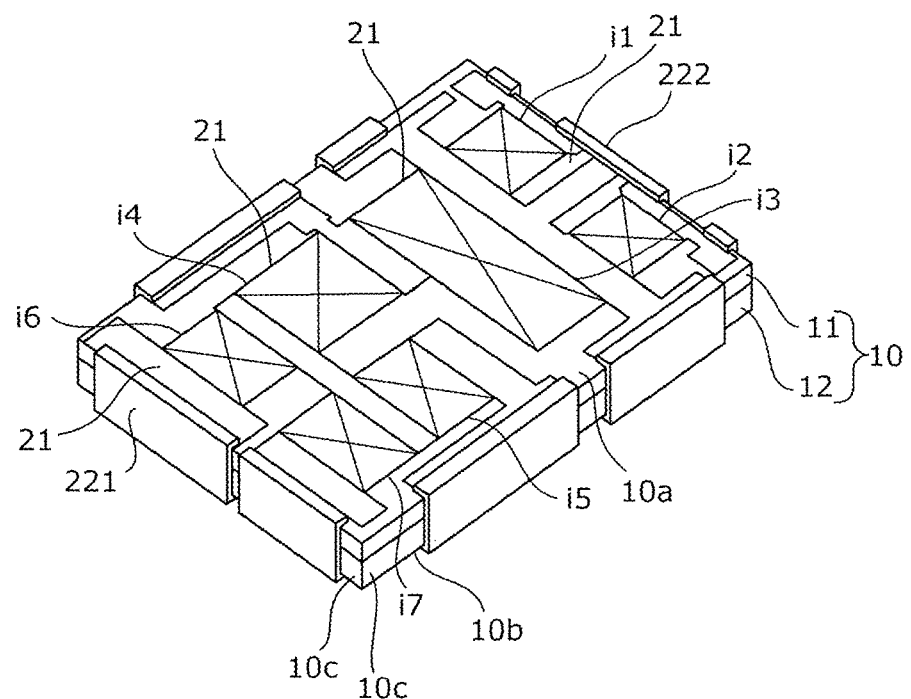
FIG. 2A is a perspective view showing an example of an element substrate, a functional electrode, a first extended wiring line, and a second extended wiring line of the acoustic wave device according to the first preferred embodiment of the present invention.
Figure 2B:
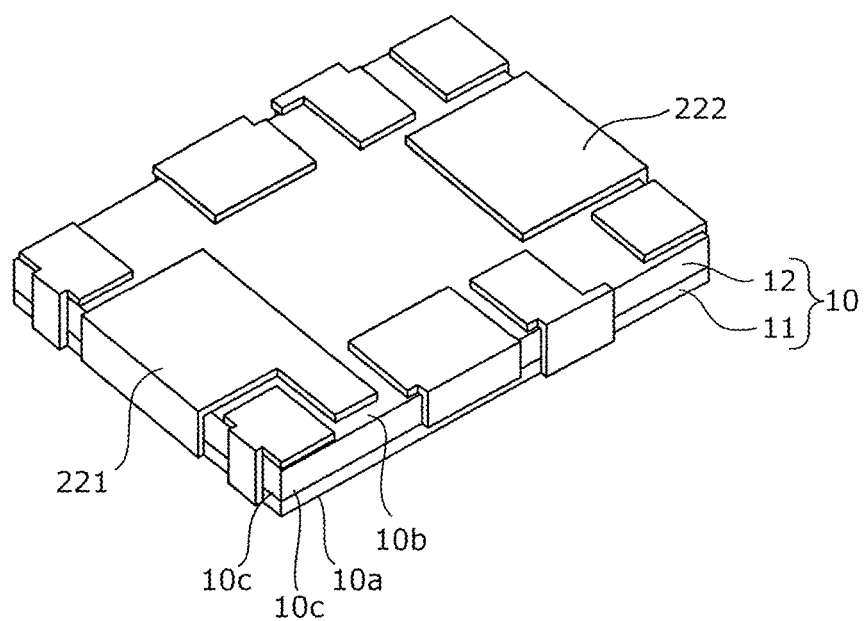
FIG. 2B is a perspective view of the element substrate, the first extended wiring line, and the second extended wiring line shown in FIG. 2A viewed from the rear surface side.

FIG. 1 is a cross-sectional view showing an example of an acoustic wave device 1 according to a first preferred embodiment of the present invention. FIG. 2A is a perspective view showing an example of an element substrate 10, a functional electrode 21, a first extended wiring line 221, and a second extended wiring line 222 of the acoustic wave device 1. FIG. 2B is a perspective view of the element substrate 10, the first extended wiring line 221, and the second extended wiring line 222 of the acoustic wave device 1 shown in FIG. 2A viewed from the rear surface side. In FIGS. 2A and 2B, the illustration of a first resin portion 31, a second resin portion 32, a third resin portion 33, a cover layer 40, a first external terminal 51, and a second external terminal 52 is omitted.

As shown in FIG. 1, the acoustic wave device 1 includes an element substrate 10; a functional electrode 21, a first extended wiring line 221, and a second extended wiring line 222 that are provided on the element substrate 10; a cover layer 40 that covers the functional electrode 21; a first external terminal 51 connected to the first extended wiring line 221; and a second external terminal 52 connected to the second extended wiring line 222. In addition, the acoustic wave device 1 includes a first resin portion 31 that seals the acoustic wave device 1; and a second resin portion 32 provided between the element substrate 10 and the first resin portion 31 on a mount surface (rear surface) side of the element substrate 10. Furthermore, the acoustic wave device 1 includes a third resin portion 33 provided along the side surfaces of the element substrate 10. The acoustic wave device 1 is mounted on a mount substrate 60 by using a first external terminal 51 and a second external terminal 52.

The element substrate 10 is preferably plate-shaped and includes a first main surface 10a and a second main surface 10b that face away from each other, and side surfaces 10c that adjoin both the first main surface 10a and the second main surface 10b and that connect the first main surface 10a and the second main surface 10b. The second main surface 10b is a surface located to the mount substrate 60 side when the acoustic wave device 1 is mounted on the mount substrate 60. The element substrate 10 includes second corner portions 17, which are portions at which the first main surface 10a and the side surfaces 10c adjoin each other, and also includes first corner portions 16, which are portions at which the second main surface 10b and the side surfaces 10c adjoin each other. The cross-sectional view in FIG. 1 shows two side surfaces 10c, two second corner portions 17, and two first corner portions 16. The side surfaces 10c may be inclined with respect to the first main surface 10a or the second main surface 10b. The first main surface 10a and the second main surface 10b need not necessarily be parallel or substantially parallel to each other. The cross section of the element substrate 10 may be trapezoid-shaped, parallelogram-shaped, or rectangle-shaped.

In addition, the element substrate 10 includes a supporting substrate 12 and a piezoelectric layer 11 provided directly on the supporting substrate 12. The piezoelectric layer 11 includes an upper surface corresponding to the above-described first main surface 10a, and the supporting substrate 12 includes a lower surface corresponding to the above-described second main surface 10b. The piezoelectric layer 11 preferably includes, for example, a piezoelectric single crystal, such as $LiTaO_3$ or $LiNbO_3$, or piezoelectric ceramics, for example. The supporting substrate 12 preferably includes an insulator or semiconductor, for example. The material of the supporting substrate 12 is preferably, for example, Si, $Al_2O_3$, or the like, for example. The acoustic velocity of a bulk wave that propagates through the supporting substrate 12 is higher than the acoustic velocity of an acoustic wave that propagates through the piezoelectric layer 11.

The functional electrode 21 is a metallic film provided on the first main surface 10a of the element substrate 10. The functional electrode 21 preferably includes, for example, an interdigital transducer (IDT) electrode and a reflector. FIG. 2A shows acoustic wave resonators i1 to i7 defined by IDT electrodes and reflectors. In FIG. 2A, the acoustic wave resonators i1 to i7 are shown with symbols each denoted by "X" enclosed with a rectangular frame. The acoustic wave resonators i1 to i7 are electrically connected to each other on the first main surface 10a and define a filter circuit, for example, a ladder filter. The functional electrode 21 is preferably made of a metal, for example, Al, Cu, or an AlCu alloy, or an alloy. The functional electrode 21 is not limited to a single-layer metallic film, and may be a multilayer metallic film including a plurality of laminated metallic films. The acoustic wave resonators i1 to i7 are not limited to surface acoustic wave resonators, and may be boundary acoustic wave resonators.

The first extended wiring line 221 and the second extended wiring line 222 are band-shaped and are provided on each of the first main surface 10a, the side surfaces 10c, and the second main surface 10b of the element substrate 10. Specifically, the first extended wiring line 221 includes a first extended wiring line 221a and a first extended wiring line 221b that are connected to each other. The first extended wiring line 221a is electrically connected to the functional electrode 21 and extends from the first main surface 10a to the side surface 10c via the second corner portion 17. The first extended wiring line 221b is connected to an end portion of the first extended wiring line 221a provided on the side surface 10c and extends from the first corner portion 16 to the second main surface 10b.

The second extended wiring line 222 includes a second extended wiring line 222a and a second extended wiring line 222b that are connected to each other. The second extended wiring line 222a is electrically connected to the functional electrode 21 and extends from the first main surface 10a to the side surface 10c via the second corner portion 17. The second extended wiring line 222b is connected to an end portion of the second extended wiring line 222a provided on the side surface 10c and extends from the first corner portion 16 to the second main surface 10b.

The first extended wiring line 221b and the second extended wiring line 222b are adjacent to each other on the second main surface 10b.

In the acoustic wave device 1, each of the first extended wiring line 221 and the second extended wiring line 222 extends along the periphery of the element substrate 10, and the heat generated on or around the first main surface 10a by driving of the functional electrode 21 can be transmitted and radiated toward the second main surface 10b through the first extended wiring line 221 and the second extended wiring line 222. In addition, because the functional electrode 21 is provided on the first main surface 10a, and the first extended wiring line 221 and the second extended wiring line 222 are extended from the functional electrode 21 to the second main surface 10b via the first main surface 10a and the side surfaces 10c, the first extended wiring line 221 and the second extended wiring line 222 are elongated and able to significantly increase heat radiation performance.

The first extended wiring line 221 and the second extended wiring line 222 are each preferably made of, for example, a metallic material including Cu. The material of the first extended wiring line 221 and the second extended wiring line 222 is not limited to Cu, and may be a metallic material including Al. In addition, the first extended wiring line 221 and the second extended wiring line 222 may include a covering layer, for example, gold plating.

The first external terminal 51 is electrically connected to the first extended wiring line 221b provided on the second main surface 10b. The second external terminal 52 is electrically connected to the second extended wiring line 222b provided on the second main surface 10b. The first external terminal 51 and the second external terminal 52 are each made of a material in which electrochemical migration is less likely to occur. Specifically, the first external terminal 51 and the second external terminal 52 each preferably includes Sn, for example, in which electrochemical migration is less likely to occur than in Cu. In addition, the first external terminal 51 and the second external terminal 52 each includes a metallic material having a lower ionization tendency than the metallic material included in the first extended wiring line 221 and the second extended wiring line 222. Specifically, the first external terminal 51 and the second external terminal 52 each preferably includes Ag, for example, having a lower ionization tendency than Cu. The element substrate 10 is bonded to one main surface 60a of the mount substrate 60 with the first external terminal 51 and the second external terminal 52 provided therebetween.

The acoustic wave device 1 includes the first external terminal 51 and the second external terminal 52. The first resin portion 31 and the second resin portion 32, which will be described below, are provided between the first external terminal 51 and the second external terminal 52.

The third resin portion 33 is provided along the first main surface 10a and the side surfaces 10c of the element substrate 10. When viewed from a direction perpendicular or substantially perpendicular to the first main surface 10a, the third resin portion 33 is provided around the functional electrode 21 to surround the functional electrode 21 in a direction along the first main surface 10a. In addition, the third resin portion 33 covers the first extended wiring line 221a and the second extended wiring line 222a. The third resin portion 33 is higher than the functional electrode 21 on the first main surface 10a side. The third resin portion 33 along the side surfaces 10c will be described below.

The cover layer 40 is preferably a sheet including, for example, a polyimide resin and is provided on the third resin portion 33 to cover the functional electrode 21 in a direction perpendicular or substantially perpendicular to the first main surface 10a. The cover layer 40 is provided at a predetermined distance from the functional electrode 21. The acoustic wave device 1 has an enclosed space A enclosed with the cover layer 40, the third resin portion 33, and the element substrate 10.

The first resin portion 31 is a sealing resin that seals the acoustic wave device 1. The first resin portion 31 is provided on outer sides of the first main surface 10a, the second main surface 10b, and the side surfaces 10c of the element substrate 10 to enclose the element substrate 10, the functional electrode 21, the first extended wiring line 221, and the second extended wiring line 222. In addition, as described above, the first resin portion 31 covers the one main surface 60a of the mount substrate 60.

The first resin portion 31 is an insulating material including a filler and is preferably made of, for example, an epoxy resin including silica particles. The epoxy resin preferably has a Young's modulus (elastic modulus) of, for example, about 17 GPa.

The second resin portion 32 is provided between the first extended wiring line 221b and the first resin portion 31 and between the second extended wiring line 222b and the first resin portion 31 on an outer side of the second main surface 10b of the element substrate 10. That is, the second resin portion 32 is provided at a position which is between the element substrate 10 and the first resin portion 31 and which is on the second main surface 10b. In addition, the second resin portion 32 is provided between the supporting substrate 12 and the first resin portion 31 in a region where neither the first extended wiring line 221b nor the second extended wiring line 222b is formed on the second main surface 10b. In addition, the second resin portion 32 is provided between the first extended wiring line 221b and the first resin portion 31 and between the second extended wiring line 222b and the first resin portion 31 on outer sides of the first corner portions 16. The second resin portion 32 is in contact with the first extended wiring line 221b and the second extended wiring line 222b, and the first resin portion 31 is not in contact with the first extended wiring line 221b or the second extended wiring line 222b.

In the first preferred embodiment, the first resin portion 31 and the second resin portion 32 are in contact with each other, and an interface f1 at which the first resin portion 31 and the second resin portion 32 are in contact with each other is located closer to the mount substrate 60 than the first extended wiring line 221b and the second extended wiring line 222b. In addition, the interface f1 is not in contact with the first extended wiring line 221b or the second extended wiring line 222b, but is in contact with the first external terminal 51 and the second external terminal 52. Specifically, as shown in the cross-sectional view in FIG. 1, one end of the interface f1 is in contact with the first external terminal 51, and the other end of the interface f1 is in contact with the second external terminal 52. In the acoustic wave device 1, the interface f1 is not in not contact with the first extended wiring line 221b or the second extended wiring line 222b, and thus electrochemical migration in which the metallic substance included in the first extended wiring line 221b and the second extended wiring line 222b moves along the interface f1 is less likely to occur.

The second resin portion 32 has a lower water absorption than the first resin portion 31. Thus, in the acoustic wave device 1, electrochemical migration is less likely to occur between the first extended wiring line 221b and the second extended wiring line 222b adjacent to each other along the second main surface 10b.

The second resin portion 32 includes an insulating resin material and preferably includes, for example, polyamic acid ester and ethyl lactate. For example, the resin material of the second resin portion 32 preferably has a Young's modulus of, for example, about 3.5 GPa. Because the second resin portion 32 has a lower Young's modulus than the first resin portion 31, the Young's modulus of the second resin portion 32 can be made lower than the Young's modulus of the first resin portion 31. Thus, even in a case where an external force is added to the acoustic wave device 1, the force to be added to the first extended wiring line 221b and the second extended wiring line 222b is reduced. In addition, when the second resin portion 32 has a lower Young's modulus than the first resin portion 31, the electrochemical migration at the interface between the supporting substrate 12 and the second resin portion 32 can be significantly reduced or prevented, compared to the electrochemical migration at the interface between the supporting substrate 12 and the first resin portion 31 in a case where the first resin portion 31 is in contact with the supporting substrate 12 without the second resin portion 32 provided therebetween, for example.

When the second resin portion 32 has a lower filler content than the first resin portion 31, the Young's modulus of the second resin portion 32 can be made lower than the Young's modulus of the first resin portion 31. Thus, even in a case where an external force is added to the acoustic wave device 1, the force to be added to the first extended wiring line 221b and the second extended wiring line 222b can be reduced.

In addition, when the second resin portion 32 has a coefficient of linear expansion closer to that of the extended wiring lines 221b and 222b than to that of the first resin portion 31, not only an external force applied to the extended wiring lines 221b and 222b but also a heat stress applied to the extended wiring lines 221b and 222b can be reduced.

The third resin portion 33 is provided between the first extended wiring line 221a and the first resin portion 31 and between the second extended wiring line 222a and the first resin portion 31 on outer sides of the side surfaces 10c of the element substrate 10. In addition, the third resin portion 33 is provided between the first extended wiring line 221a and the first resin portion 31 and between the second extended wiring line 222a and the first resin portion 31 on outer sides of the second corner portions 17. The third resin portion 33 is in contact with the first extended wiring line 221a and the second extended wiring line 222a, and the first resin portion 31 is not in contact with the first extended wiring line 221a or the second extended wiring line 222a.

The third resin portion 33 is an insulating material and is preferably made of, for example, an epoxy resin. The epoxy resin has a Young's modulus of, for example, about 2 GPa. The third resin portion 33 has a lower Young's modulus than the first resin portion 31. Thus, in the acoustic wave device 1, even in a case where an external force is added thereto, the force to be added to the first extended wiring line 221a and the second extended wiring line 222a is reduced.

When the third resin portion 33 has a lower filler content than the first resin portion 31, the Young's modulus of the third resin portion 33 can be made lower than the Young's modulus of the first resin portion 31. Thus, even in a case where an external force is added to the acoustic wave device 1, the force to be added to the first extended wiring line 221a and the second extended wiring line 222a can be reduced.

In addition, when the third resin portion 33 has a coefficient of linear expansion closer to that of the extended wiring lines 221a and 222a than to that of the first resin portion 31, not only an external force applied to the extended wiring lines 221a and 222a but also a heat stress applied to the extended wiring lines 221a and 222a can be reduced.

Figure 3:
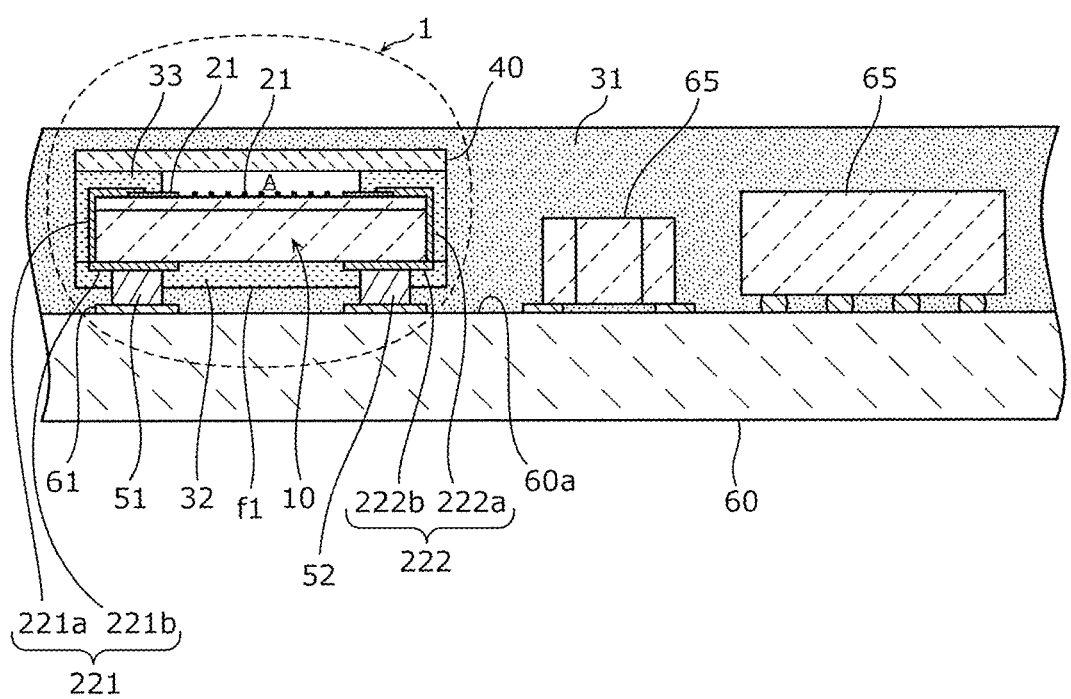
FIG. 3 is a cross-sectional view showing another example of the acoustic wave device according to the first preferred embodiment of the present invention.

FIG. 3 is a cross-sectional view showing another example of the acoustic wave device 1, in which the acoustic wave device 1 defines and functions as a portion of a high-frequency module. The high-frequency module includes, for example, the acoustic wave device 1, mounted components 65, and the mount substrate 60.

The mount substrate 60 is a printed circuit board. The one main surface 60a of the mount substrate 60 includes land electrodes 61 provided thereon. The first external terminal 51 and the second external terminal 52 of the acoustic wave device 1 are connected to the mount substrate 60 with the land electrodes 61 provided therebetween. In addition to the acoustic wave device 1, a multilayer ceramic component and an IC chip, which are the mounted components 65, are mounted on the mount substrate 60. The first resin portion 31 is provided on the one main surface 60a of the mount substrate 60 to cover the acoustic wave device 1 and the mounted components 65. In this way, the acoustic wave device 1 may define the high-frequency module while being integrated with the mount substrate 60.

1-2. Method for Manufacturing Acoustic Wave Devices

Figure 4:
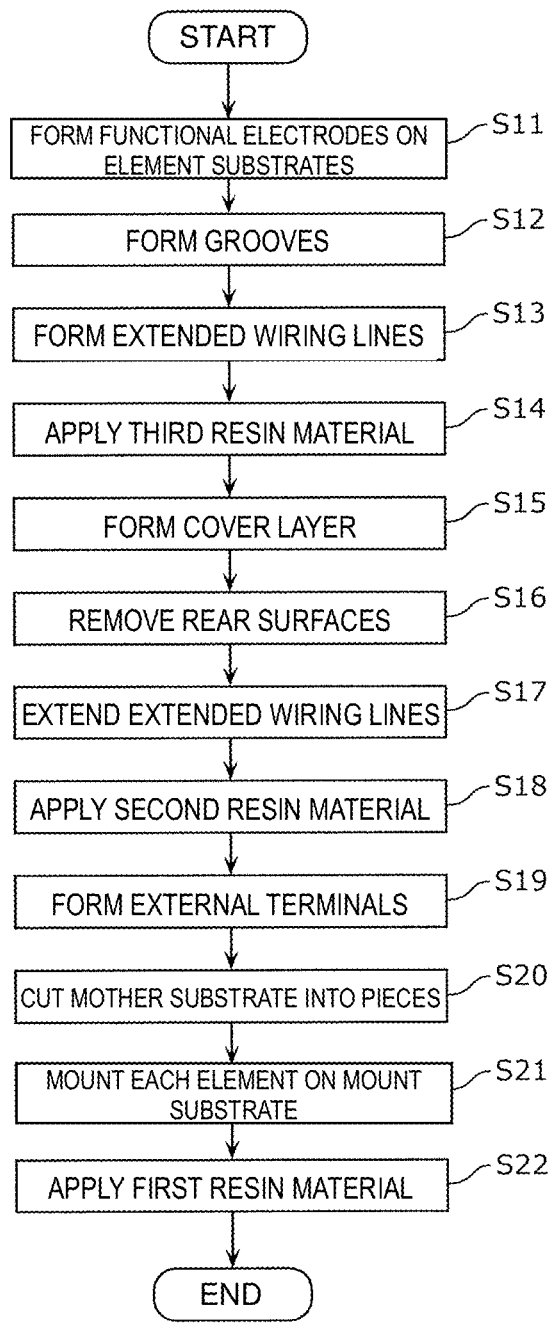
FIG. 4 is a flowchart showing a method for manufacturing the acoustic wave devices according to the first preferred embodiment of the present invention.
Figure 5:
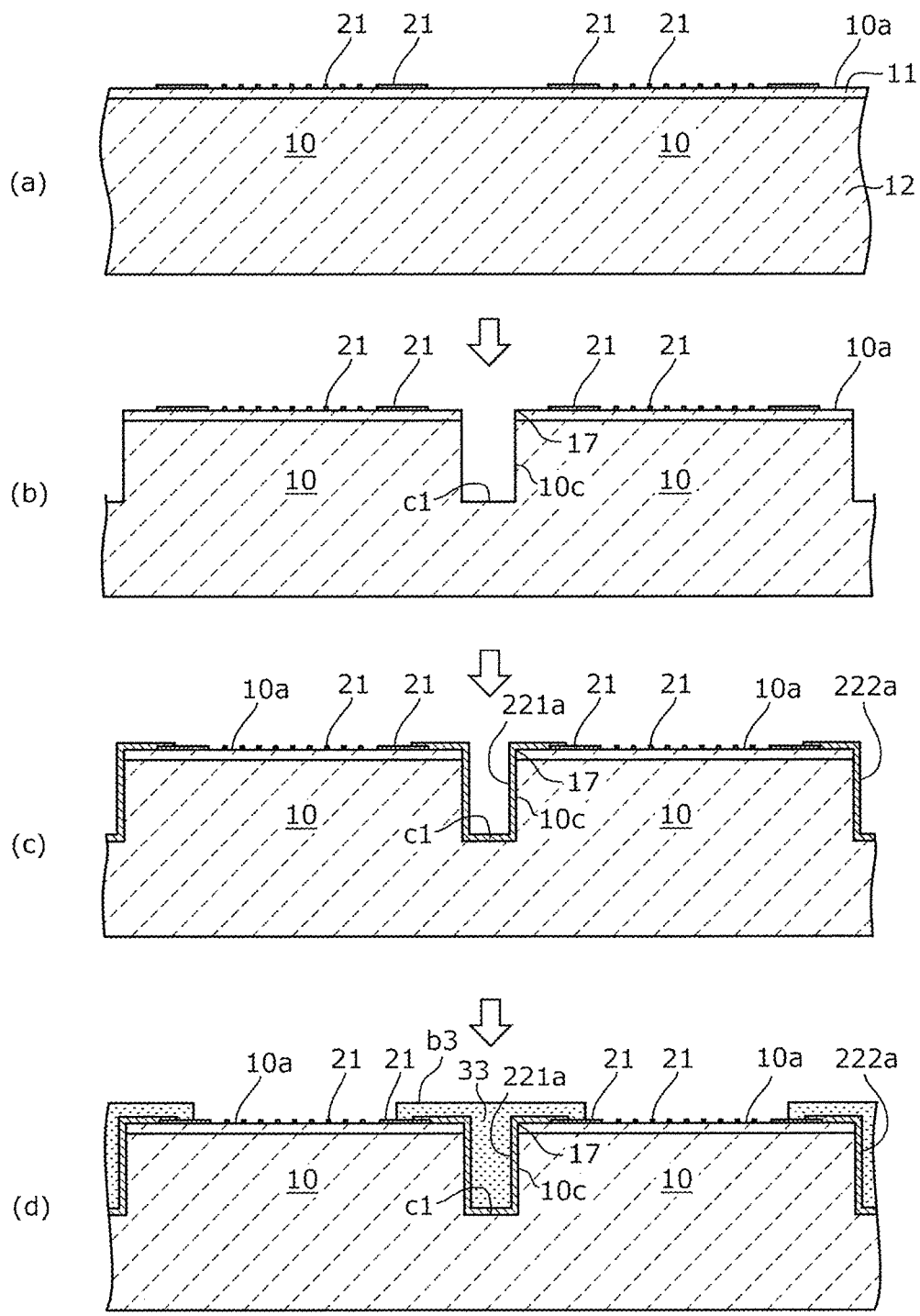
FIG. 5 includes diagrams showing the method for manufacturing the acoustic wave devices according to the first preferred embodiment of the present invention.

Next, a method for manufacturing the acoustic wave devices 1 will be described. FIG. 4 is a flowchart showing the method for manufacturing the acoustic wave devices 1. FIG. 5 includes diagrams showing the method for manufacturing the acoustic wave devices 1, FIG. 6 includes diagrams showing the method for manufacturing the acoustic wave devices 1 continued from FIG. 5, and FIG. 7 includes diagrams showing the method for manufacturing the acoustic wave devices 1 continued from FIG. 6.

First, as shown in part (a) of FIG. 5, the functional electrodes 21 are formed on the element substrates 10 (S11). The functional electrodes 21 are formed on the first main surfaces 10a, which are the upper surfaces of the piezoelectric layers 11. The functional electrodes 21 are, for example, electrode films defining and functioning as IDT electrodes and reflectors. The element substrates 10 are in the state of a mother substrate before being divided into pieces. Part (a) of FIG. 5 shows two element substrates 10 as an example.

Subsequently, as shown in part (b) of FIG. 5, grooves c1 are formed in the element substrates 10 (S12). The grooves c1 are formed in a lattice pattern viewed from a direction perpendicular to the first main surface 10a. As a result of forming the grooves c1, the side surfaces 10c of each element substrate 10 are formed.

Subsequently, as shown in part (c) of FIG. 5, the first extended wiring lines 221a and the second extended wiring lines 222a are formed on the surfaces of the grooves c1 and the surfaces of the element substrates 10 (S13). The first extended wiring lines 221a and the second extended wiring lines 222a are formed, with a predetermined film thickness, along the side surfaces 10c of the element substrates 10, which are side surfaces of the grooves c1, and the first main surfaces 10a of the element substrates 10. On the first main surfaces 10a, the first extended wiring lines 221a and the second extended wiring lines 222a are connected to the functional electrodes 21.

Subsequently, as shown in part (d) of FIG. 5, a third resin material b3 is applied onto the grooves c1 and the first main surfaces 10a on which the first extended wiring lines 221a and the second extended wiring lines 222a have been formed (S14). The resin material b3 covers the first extended wiring lines 221a and the second extended wiring lines 222a. In addition, the resin material b3 surrounds the functional electrodes 21 in a direction along the first main surfaces 10a and is higher than the functional electrodes 21 in a height direction. As a result of applying and curing the resin material b3, the third resin portions 33 are formed on outer sides of the side surfaces 10c and outer sides of the second corner portions 17 of the element substrates 10.

Figure 6:
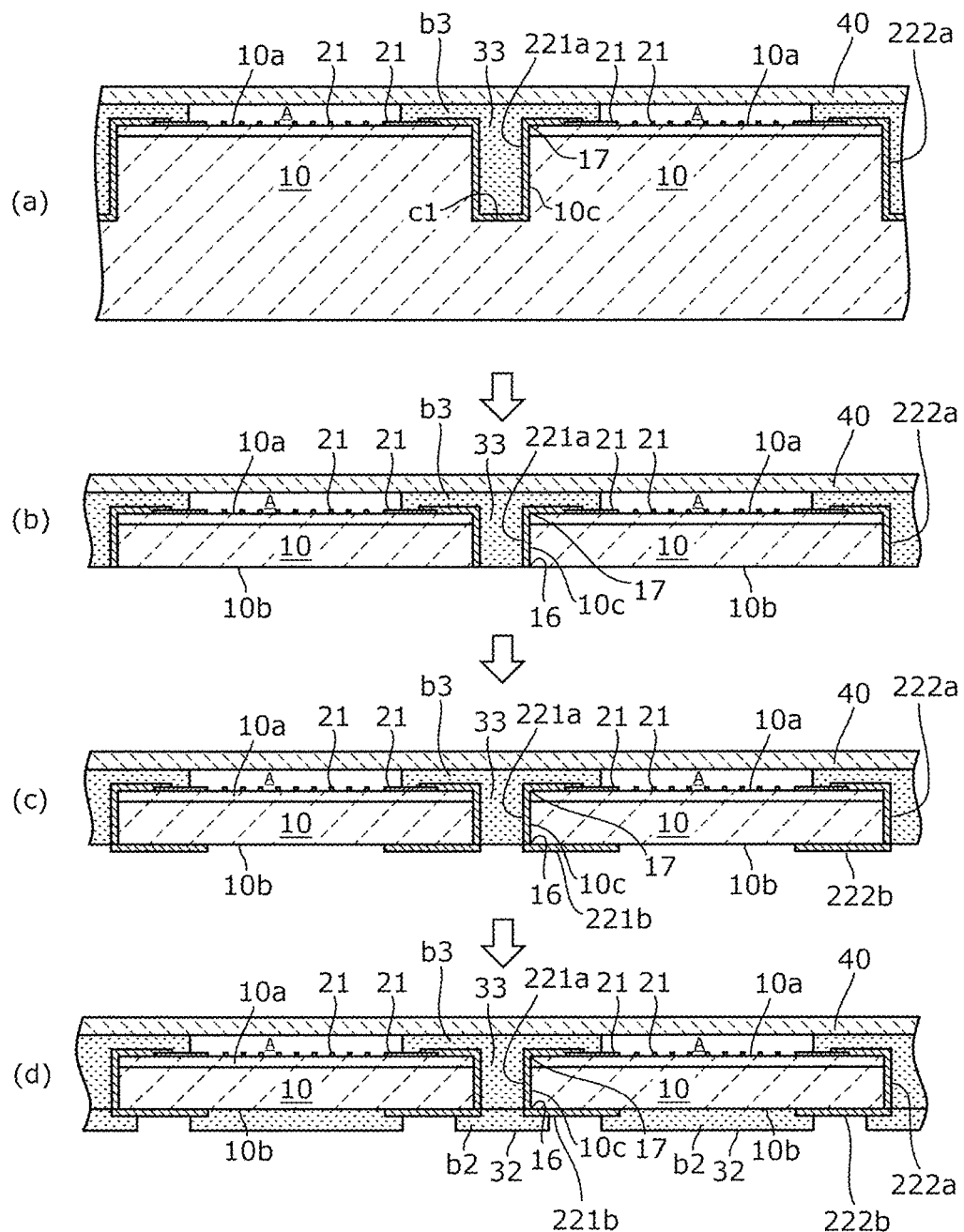
FIG. 6 includes diagrams showing the method for manufacturing the acoustic wave devices according to the first preferred embodiment of the present invention continued from FIG. 5.

Subsequently, as shown in part (a) of FIG. 6, the cover layer 40 is formed on the third resin portions 33 (S15). The cover layer 40 is a sheet including a polyimide resin and is bonded to the third resin portions 33 with an adhesive. As a result of forming the cover layer 40, the enclosed spaces A are formed above the functional electrodes 21.

Subsequently, as shown in part (b) of FIG. 6, the rear surfaces of the element substrates 10 are removed by using a grinder or the like (S16). As a result of the removal, the second main surfaces 10b of the element substrates 10 are formed, and a portion of the first extended wiring lines 221a and the second extended wiring lines 222a and a portion of the third resin portions 33 that have been formed in the grooves c1 are exposed.

Subsequently, as shown in part (c) of FIG. 6, the first extended wiring lines 221b and the second extended wiring lines 222b are extended to the exposed second main surfaces 10b (S17). The first extended wiring lines 221b and the second extended wiring lines 222b are connected to the first extended wiring lines 221a and the second extended wiring lines 222a formed in step S13, respectively.

Subsequently, as shown in part (d) of FIG. 6, a second resin material b2 is applied onto the second main surfaces 10b on which the first extended wiring lines 221b and the second extended wiring lines 222b have been formed (S18). The resin material b2 covers the first extended wiring lines 221b and the second extended wiring lines 222b and to cover the second main surfaces 10b, except for the regions where the first external terminals 51 and the second external terminals 52 are to be formed. As a result of applying and curing the resin material b2, the second resin portions 32 are formed on outer sides of the second main surfaces 10b and outer sides of the first corner portions 16 of the element substrates 10. The regions where the second resin portions 32 are not formed are recessed, and the first extended wiring lines 221b or the second extended wiring lines 222b are exposed there.

Subsequently, as shown in part (a) of FIG. 7, the first external terminals 51 and the second external terminals 52 are formed in the regions where the second resin portions 32 are not formed (S19). The first external terminals 51 and the second external terminals 52 are, for example, metallic bumps. As a result of forming the first external terminals 51 and the second external terminals 52, the first extended wiring lines 221b and the first external terminals 51 are connected to each other, and the second extended wiring lines 222b and the second external terminals 52 are connected to each other.

Subsequently, as shown in part (b) of FIG. 7, the mother substrate including the plurality of element substrates 10 is cut into pieces (S20). The blade used to cut the plurality of element substrates 10 has a width smaller than the width of the groove c1 formed in step S12. As a result of the cutting, elements d1, each of which is a portion of the acoustic wave device 1, are formed, and the side surfaces of the cover layers 40, the third resin portions 33, and the second resin portions 32 are formed.

Subsequently, as shown in part (c) of FIG. 7, each element d1 provided by the cutting is mounted on the mount substrate 60 (S21). The element d1 is bonded to the land electrodes 61 of the mount substrate 60 by soldering or the like.

Subsequently, a first resin material is applied to the one main surface 60a of the mount substrate 60 to cover the element d1 and the first resin material is cured (S22). As a result of curing the first resin material, the first resin portion 31 encloses the element substrate 10, the functional electrode 21, the first extended wiring line 221, and the second extended wiring line 222 and to further enclose the cover layer 40, the second resin portion 32, and the third resin portion 33 on the outer side thereof. Accordingly, the acoustic wave device 1 as shown in FIG. 1 is formed.

1-3. Advantages

In the acoustic wave device 1 having the above-described features and configuration, the occurrence of electrochemical migration in the metallic substance included in the first extended wiring line 221b and the second extended wiring line 222b is able to be significantly reduced or prevented. To facilitate the understanding of this, an acoustic wave device according to a comparative example will be described.

Figure 16:
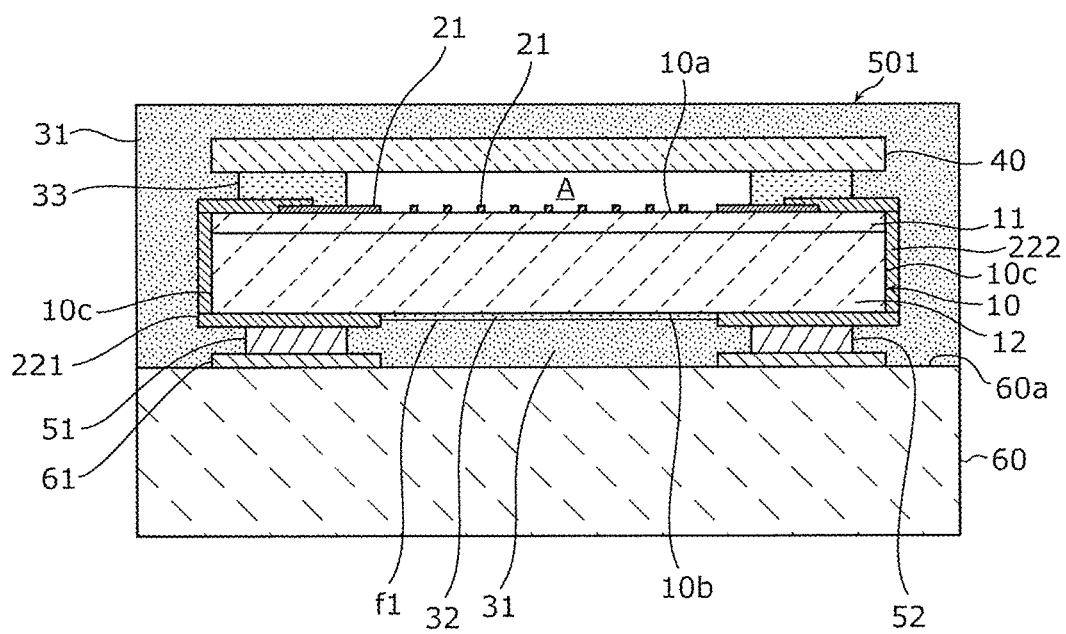
FIG. 16 is a cross-sectional view showing an acoustic wave device according to a comparative example.

FIG. 16 is a cross-sectional view showing an acoustic wave device 501 according to the comparative example. The acoustic wave device 501 according to the comparative example includes the element substrate 10; the functional electrode 21, the first extended wiring line 221, and the second extended wiring line 222 that are provided on the element substrate 10; the cover layer 40 that covers the functional electrode 21; the first external terminal 51 connected to the first extended wiring line 221; and the second external terminal 52 connected to the second extended wiring line 222. In addition, the acoustic wave device 501 includes the second resin portion 32 provided on the second main surface 10b of the element substrate 10; and the first resin portion 31 that encloses the entire or substantially the entire element substrate 10, the first extended wiring line 221 and the second extended wiring line 222, the cover layer 40, and the second resin portion 32.

In the acoustic wave device 501 according to the comparative example, the interface f1 between the second resin portion 32 and the first resin portion 31 is in contact with the first extended wiring line 221 and the second extended wiring line 222. Thus, in the acoustic wave device 501, application of a high-frequency voltage thereto causes the metallic substance included in the first extended wiring line 221 and the second extended wiring line 222 to move along the interface f1, thus causing electrochemical migration.

In contrast, the acoustic wave device 1 according to the first preferred embodiment has the following features and configuration. That is, the acoustic wave device 1 includes the element substrate 10 that includes the first main surface 10a and the second main surface 10b facing away from each other and that at least partially has piezoelectricity; the functional electrode that is provided directly or indirectly on the first main surface 10a of the element substrate 10; the first extended wiring line 221b and the second extended wiring line 222b that are provided directly or indirectly on the second main surface 10b of the element substrate 10, that are electrically connected to the functional electrode 21, and that are adjacent to each other; the first external terminal 51 that is electrically connected to the first extended wiring line 221b and that is provided directly or indirectly on the second main surface 10b of the element substrate 10; the second external terminal 52 that is electrically connected to the second extended wiring line 222b and that is provided directly or indirectly on the second main surface 10b of the element substrate 10; the first resin portion 31 that seals the acoustic wave device 1; and the second resin portion 32 that is provided at least at a position which is between the element substrate 10 and the first resin portion 31 and which is on the second main surface 10b. The second resin portion 32 has a lower Young's modulus than the first resin portion 31, the first resin portion 31 and the second resin portion 32 are in contact with each other, and the interface f1 at which the first resin portion 31 and the second resin portion 32 are in contact with each other is located closer to the mount substrate 60 than the first extended wiring line 221b and the second extended wiring line 222b.

With this structure in which the interface f1 between the first resin portion 31 and the second resin portion 32 is located closer to the mount substrate 60 than the first extended wiring line 221b and the second extended wiring line 222b, the movement of the metallic substance included in the first extended wiring line 221b and the second extended wiring line 222b along the interface f1 is able to be significantly reduced or prevented. Accordingly, the occurrence of electrochemical migration in the metallic substance included in the first extended wiring line 221b and the first extended wiring line 222b is able to be significantly reduced or prevented.

In addition, in the present preferred embodiment, the second resin portion 32 has a lower Young's modulus than the first resin portion 31. Thus, the electrochemical migration at the interface between the supporting substrate 12 and the second resin portion 32 is able to be significantly reduced or prevented, compared to the electrochemical migration at the interface between the supporting substrate 12 and the first resin portion 31 in a case where the first resin portion 31 is in contact with the supporting substrate 12 without the second resin portion 32 provided therebetween.

In addition, in the acoustic wave device 1, the interface f1 at which the first resin portion 31 and the second resin portion 32 are in contact with each other is not in contact with the first extended wiring line 221b or the second extended wiring line 222b but is in contact with the first external terminal 51 and the second external terminal 52.

With this structure in which the interface f1 between the first resin portion 31 and the second resin portion 32 is not in contact with the first extended wiring line 221b or the second extended wiring line 222b but is in contact with the first external terminal 51 and the second external terminal 52, the movement of the metallic substance included in the first extended wiring line 221b and the second extended wiring line 222b along the interface f1 is able to be significantly reduced or prevented. Accordingly, the occurrence of electrochemical migration in the metallic substance included in the first extended wiring line 221b and the second extended wiring line 222b is able to be significantly reduced or prevented.

In the first preferred embodiment, the first external terminal 51 and the second external terminal 52 that are in contact with the interface f1 are include a material in which electrochemical migration is less likely to occur. This, even in a case where the interface f1 is in contact with the first external terminal 51 and the second external terminal 52, electrochemical migration in the metallic substance included in the first external terminal 51 and the second external terminal 52 is able to be significantly reduced or prevented.

1-4. First Modified Example of First Preferred Embodiment

Figure 8:
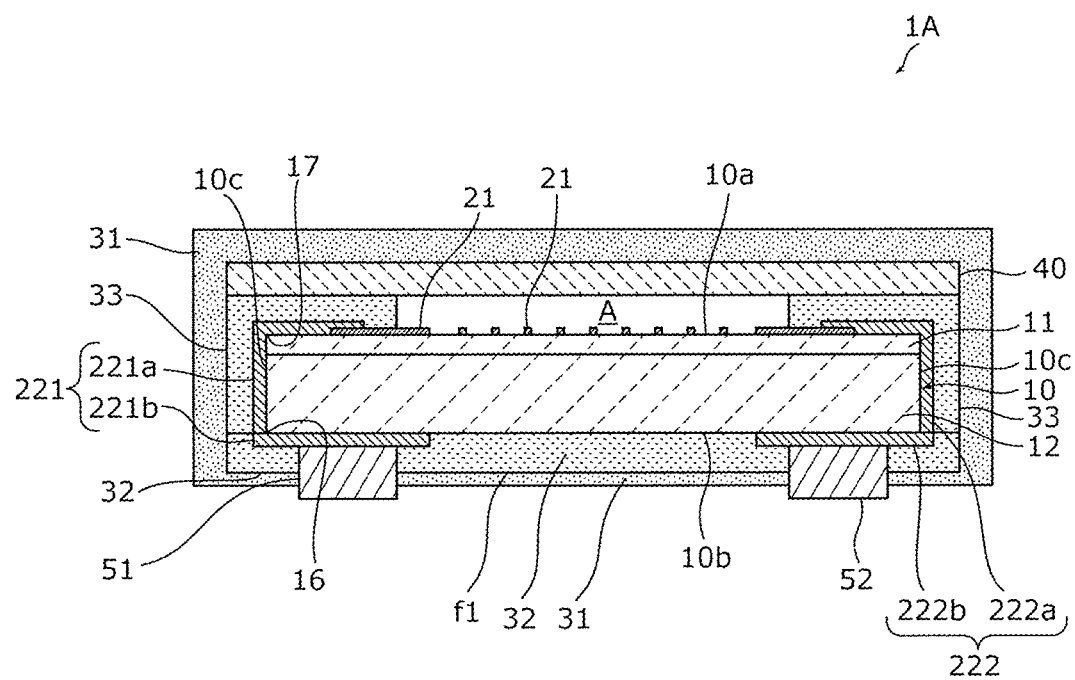
FIG. 8 is a cross-sectional view showing an acoustic wave device according to a first modified example of the first preferred embodiment of the present invention.

FIG. 8 is a cross-sectional view showing an acoustic wave device 1A according to a first modified example of the first preferred embodiment. FIG. 8 shows the acoustic wave device 1A that is to be mounted on the mount substrate 60. In the acoustic wave device 1A, the first resin portion 31 is not provided on the mount substrate 60 but is provided only to the acoustic wave device 1A, which is different from the first preferred embodiment in which the first resin portion 31 is provided on the mount substrate 60. The first resin portion 31 can be formed by, for example, printing, immersion, or the like.

Also in the acoustic wave device 1A according to the first modified example, the interface f1 between the first resin portion 31 and the second resin portion 32 is located closer to the mount substrate 60 than the first extended wiring line 221b and the second extended wiring line 222b. With this structure, the movement of the metallic substance included in the first extended wiring line 221b and the second extended wiring line 222b along the interface f1 is able to be significantly reduced or prevented. Accordingly, the occurrence of electrochemical migration in the metallic substance included in the first extended wiring line 221b and the second extended wiring line 222b is able to be significantly reduced or prevented.

1-5. Second Modified Example of First Preferred Embodiment

Figure 9:
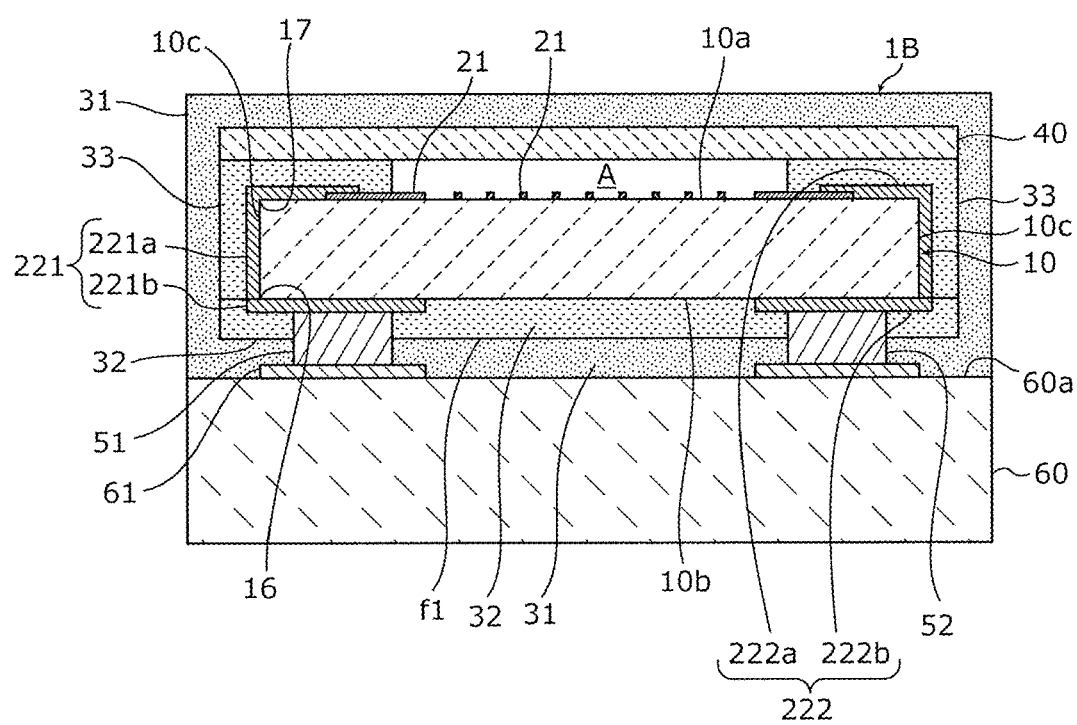
FIG. 9 is a cross-sectional view showing an acoustic wave device according to a second modified example of the first preferred embodiment of the present invention.

FIG. 9 is a cross-sectional view showing an acoustic wave device 1B according to a second modified example of the first preferred embodiment. In the acoustic wave device 1B shown in FIG. 9, the element substrate 10 includes only a piezoelectric layer, which is different from the first preferred embodiment in which the element substrate 10 includes the supporting substrate 12 and the piezoelectric layer 11.

Also in the acoustic wave device 1B according to the second modified example, the interface f1 between the first resin portion 31 and the second resin portion 32 is located closer to the mount substrate 60 than the first extended wiring line 221b and the second extended wiring line 222b. With this structure, the movement of the metallic substance included in the first extended wiring line 221b and the second extended wiring line 222b along the interface f1 is able to be significantly reduced or prevented. Accordingly, the occurrence of electrochemical migration in the metallic substance included in the first extended wiring line 221b and the second extended wiring line 222b is able to be significantly reduced or prevented.

1-6. Third Modified Example of First Preferred Embodiment

Figure 10:
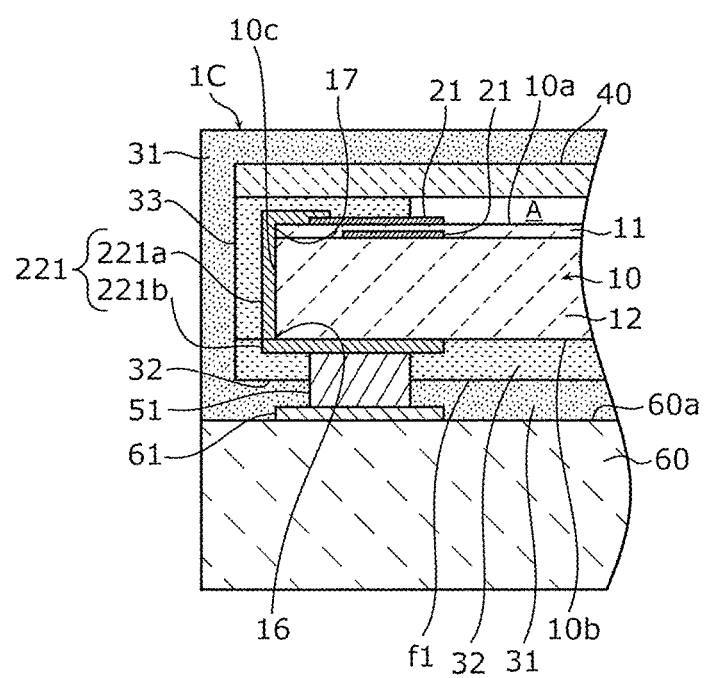
FIG. 10 is a cross-sectional view showing an acoustic wave device according to a third modified example of the first preferred embodiment of the present invention.

FIG. 10 is a cross-sectional view showing an acoustic wave device 1C according to a third modified example of the first preferred embodiment. In the acoustic wave device 1C shown in FIG. 10, the functional electrode 21 is provided between the supporting substrate 12 and the piezoelectric layer 11 and on the piezoelectric layer 11, which is different from the first preferred embodiment in which the functional electrode 21 is not present between the supporting substrate 12 and the piezoelectric layer 11. The first extended wiring line 221a and the second extended wiring line 222a are connected to the functional electrode 21 on the piezoelectric layer 11, that is, on the first main surface 10a.

Also in the acoustic wave device 1C according to the third modified example, the interface f1 between the first resin portion 31 and the second resin portion 32 is located closer to the mount substrate 60 than the first extended wiring line 221b and the second extended wiring line 222b. With this structure, the movement of the metallic substance included in the first extended wiring line 221b and the second extended wiring line 222b along the interface f1 is able to be significantly reduced or prevented. Accordingly, the occurrence of electrochemical migration in the metallic substance included in the first extended wiring line 221b and the second extended wiring line 222b is able to be significantly reduced or prevented.

1-7. Fourth Modified Example of First Preferred Embodiment

Figure 11:
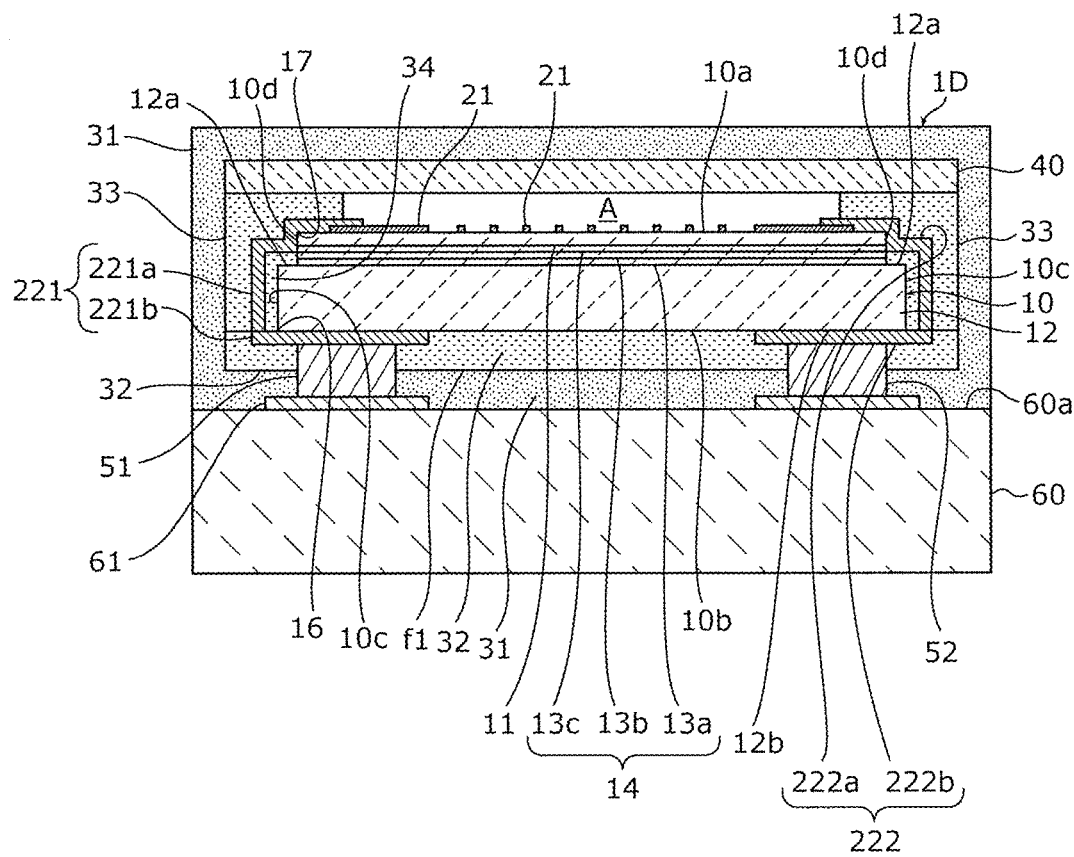
FIG. 11 is a cross-sectional view showing an acoustic wave device according to a fourth modified example of the first preferred embodiment of the present invention.

FIG. 11 is a cross-sectional view showing an acoustic wave device 1D according to a fourth modified example of the first preferred embodiment. In the acoustic wave device 1D according to the fourth modified example, the element substrate 10 includes the supporting substrate 12 including a silicon material, an intermediate layer 14 provided on the supporting substrate 12, and the piezoelectric layer 11 provided on the intermediate layer 14, which is different from the first preferred embodiment in which the element substrate 10 includes the supporting substrate 12 and the piezoelectric layer 11. The piezoelectric layer 11 of the acoustic wave device 1D is provided indirectly on the supporting substrate 12. The supporting substrate 12 includes another main surface 12b, which is the same or substantially the same as the second main surface 10b of the element substrate 10, and one main surface 12a opposite to the other main surface 12b.

The intermediate layer 14 includes a higher-order mode leakage layer 13a, a high-acoustic-velocity film 13b, and a low-acoustic-velocity film 13c. Specifically, the higher-order mode leakage layer 13a, which is made of a film that prevents leakage of a higher-order mode, is laminated on the supporting substrate 12, the high-acoustic-velocity film 13b having a relatively high acoustic velocity is laminated on the higher-order mode leakage layer 13a, the low-acoustic-velocity film 13c having a relatively low acoustic velocity is laminated on the high-acoustic-velocity film 13b, and the piezoelectric layer 11 is laminated on the low-acoustic-velocity film 13c. An appropriate material may be provided between the intermediate layer 14 and the supporting substrate 12.

The higher-order mode leakage layer 13a can be made by using an appropriate material that prevents leakage of a higher-order mode, for example, silicon oxide or the like.

The high-acoustic-velocity film 13b confines an acoustic wave within a portion where the piezoelectric layer 11 and the low-acoustic-velocity film 13c are laminated to prevent the acoustic wave from being leaked below the high-acoustic-velocity film 13b. The high-acoustic-velocity film 13b preferably includes, for example, aluminum nitride. As long as the acoustic wave can be confined, various high-acoustic-velocity materials may be used, for example, aluminum nitride, aluminum oxide, silicon carbide, silicon nitride, silicon oxynitride, a DLC film or diamond, a medium mainly including any of these materials, or a medium mainly including a mixture of these materials. To confine the acoustic wave within the portion where the piezoelectric layer 11 and the low-acoustic-velocity film 13c are laminated, the high-acoustic-velocity film 13b is preferably, for example, as thick as possible, and preferably, for example, has a thickness that is about 0.1 times or more the wavelength λ of the acoustic wave, furthermore, about 1.5 times or more the wavelength λ of the acoustic wave.

The low-acoustic-velocity film 13c preferably includes, for example, silicon oxide. As the material of the low-acoustic-velocity film 13c, an appropriate material having an acoustic velocity of a bulk wave lower than that of a bulk wave that propagates through the piezoelectric layer 11 may be used, for example, a material include silicon oxide, glass, silicon oxynitride, tantalum oxide, and a medium mainly including any of the above materials, for example, a compound provided by adding fluorine, carbon, or boron to silicon oxide.

The high-acoustic-velocity film 13b is a film in which the acoustic velocity of a bulk wave in the high-acoustic-velocity film 13b is higher than that of a surface acoustic wave or a boundary acoustic wave that propagates through the piezoelectric layer 11. The low-acoustic-velocity film 13c is a film in which the acoustic velocity of a bulk wave in the low-acoustic-velocity film 13c is lower than that of a bulk wave that propagates through the piezoelectric layer 11.

With the higher-order mode leakage layer 13a, the high-acoustic-velocity film 13b, and the low-acoustic-velocity film 13c being provided between the piezoelectric layer 11 and the supporting substrate 12, a Q value can be increased.

In the acoustic wave device 1D, the piezoelectric layer 11 and the intermediate layer 14 have a smaller outer shape than the supporting substrate 12 when viewed from a direction perpendicular or substantially perpendicular to the first main surface 10a, and side surfaces 10d of the piezoelectric layer 11 and the intermediate layer 14 are located on inner sides of the side surfaces 10c of the element substrate 10 when viewed in a cross section.

Figure 7:
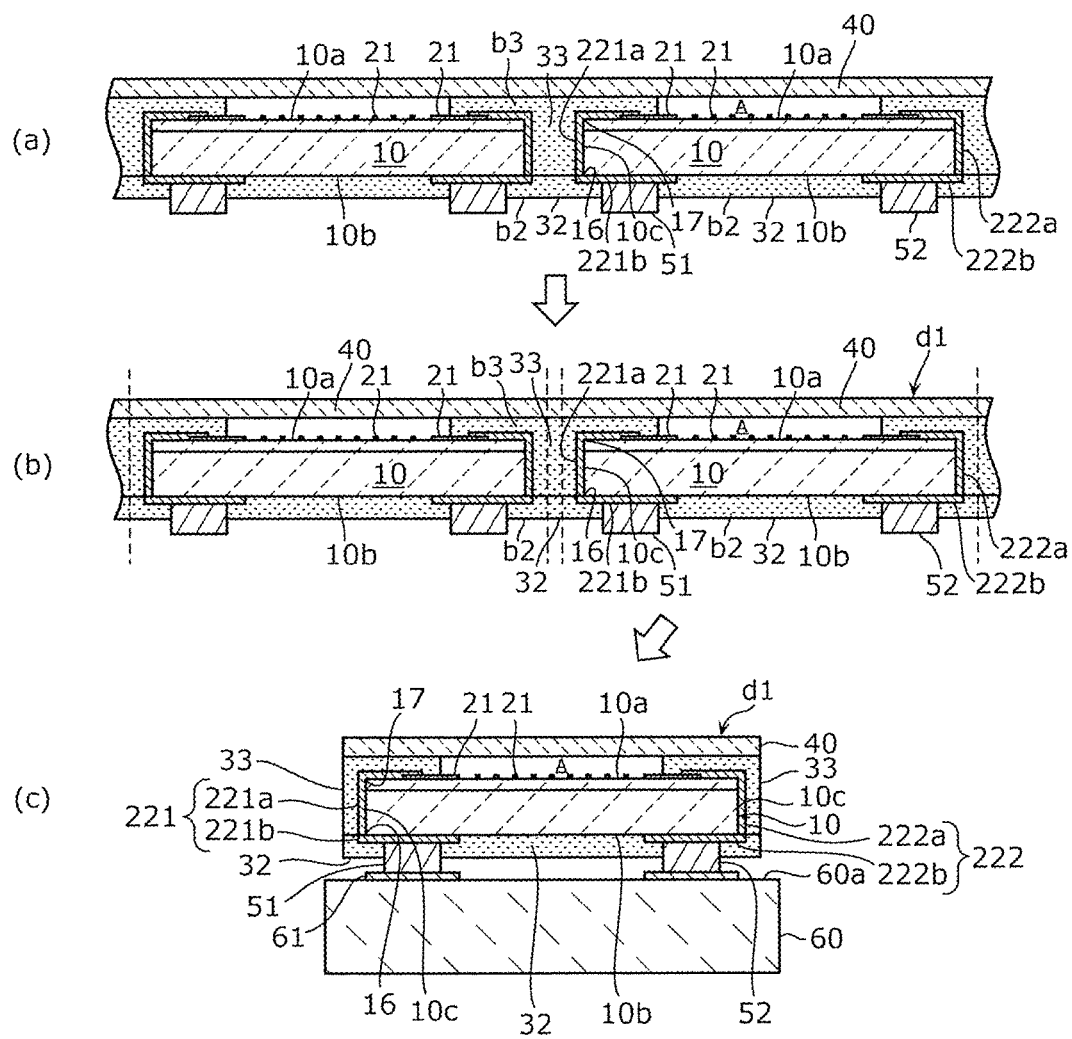
FIG. 7 includes diagrams showing the method for manufacturing the acoustic wave devices according to the first preferred embodiment of the present invention continued from FIG. 6.

For example, with the side surfaces 10d of the piezoelectric layer 11 and the intermediate layer 14 being provided on inner sides of the side surfaces 10c of the element substrate 10, the piezoelectric layer 11 and the intermediate layer 14 can be prevented from being touched by a dicing blade during the step of cutting the mother substrate into pieces by using the dicing blade (see part (b) of FIG. 7), and cracking or interfacial delamination of the piezoelectric layer 11 and the intermediate layer 14 can be significantly reduced or prevented.

The first extended wiring line 221a and the second extended wiring line 222a extend from the first main surface 10a along the side surfaces 10d of the piezoelectric layer 11 and the intermediate layer 14, the one main surface 12a of the supporting substrate 12, and the side surfaces 10c.

Also in the acoustic wave device 1D according to the fourth modified example, the interface f1 between the first resin portion 31 and the second resin portion 32 is located closer to the mount substrate 60 than the first extended wiring line 221b and the second extended wiring line 222b. With these features, the movement of the metallic substance included in the first extended wiring line 221b and the second extended wiring line 222b along the interface f1 is able to be significantly reduced or prevented. Accordingly, the occurrence of electrochemical migration in the metallic substance included in the first extended wiring line 221b and the second extended wiring line 222b is able to be significantly reduced or prevented.

In addition, in the acoustic wave device 1D, a fourth resin portion 34 is provided on the side surfaces 10c of the element substrate 10 and the one main surface 12a of the supporting substrate 12. That is, the fourth resin portion 34 is provided between the side surfaces 10c of the element substrate 10 and the one main surface 12a of the supporting substrate 12, and the first extended wiring line 221a and the second extended wiring line 222a. For example, in a case where the side surfaces 10c of the element substrate 10 are in contact with the first extended wiring line 221a and the second extended wiring line 222a, a leak current is likely to flow into the supporting substrate 12. In contrast, in a case where the fourth resin portion 34 is provided between the side surfaces 10c of the element substrate 10 and the first and second extended wiring lines 221a and 222a as in the acoustic wave device 1D, flowing of a leak current into the supporting substrate 12 is able to be significantly reduced or prevented.

In the fourth modified example, the element substrate 10 may have the following multilayer structure.

The element substrate 10 includes the supporting substrate 12, the intermediate layer 14 provided on the supporting substrate 12, and the piezoelectric layer 11 provided on the intermediate layer 14. The piezoelectric layer 11 is provided indirectly on the supporting substrate 12.

The supporting substrate 12 includes the one main surface 12a and the other main surface 12b that face away from each other. The supporting substrate 12 is made of a material in which the acoustic velocity of a bulk wave that propagates therethrough is higher than the acoustic velocity of an acoustic wave that propagates through the piezoelectric layer 11. Examples of the material of the supporting substrate 12 include semiconductor such as Si, sapphire, LiTaO$_3$ (hereinafter referred to as "LT"), LiNbO$_3$ (hereinafter referred to as "LN"), glass, and the like. These materials may be used alone, or a plurality of them may be used in combination.

The intermediate layer 14 is provided on the one main surface 12a of the supporting substrate 12. The intermediate layer 14 is located immediately below the piezoelectric layer 11 and is in contact with the piezoelectric layer 11. The intermediate layer 14 that is in contact with the piezoelectric layer 11 prevents the energy of an acoustic wave propagating through the piezoelectric layer 11 from leaking in the thickness direction.

The intermediate layer 14 is made of a material in which the acoustic velocity of a bulk wave that propagates therethrough is lower than the acoustic velocity of an acoustic wave that propagates through the piezoelectric layer 11. The intermediate layer 14 is preferably made of, for example, a polycrystalline, amorphous, or uniaxially oriented film, and has crystal grains and grain boundaries.

Specifically, the intermediate layer 14 is preferably made of, for example, an SiO$_2$ layer. As the material of the intermediate layer 14, silicon nitride, aluminum nitride, or the like may be used instead of SiO$_2$. These materials may be used alone, or a plurality of them may be used in combination. From the viewpoint of increasing the adhesion with the supporting substrate 12, SiO$_2$ is preferably used as the material of the intermediate layer 14, for example.

The piezoelectric layer 11 is provided on the intermediate layer 14. The piezoelectric layer 11 is a thin film. Preferably, the piezoelectric layer 11 has a thickness of, for example, about 3.5λ or less, where λ represents the wavelength of an acoustic wave. In this case, the acoustic wave can be excited to a greater extent. The piezoelectric layer 11 is preferably made of, for example, LT. As the material of the piezoelectric layer 11, another piezoelectric single crystal, for example, LN, or piezoelectric ceramics may be used.

1-8. Fifth Modified Example of First Preferred Embodiment

Figure 12:
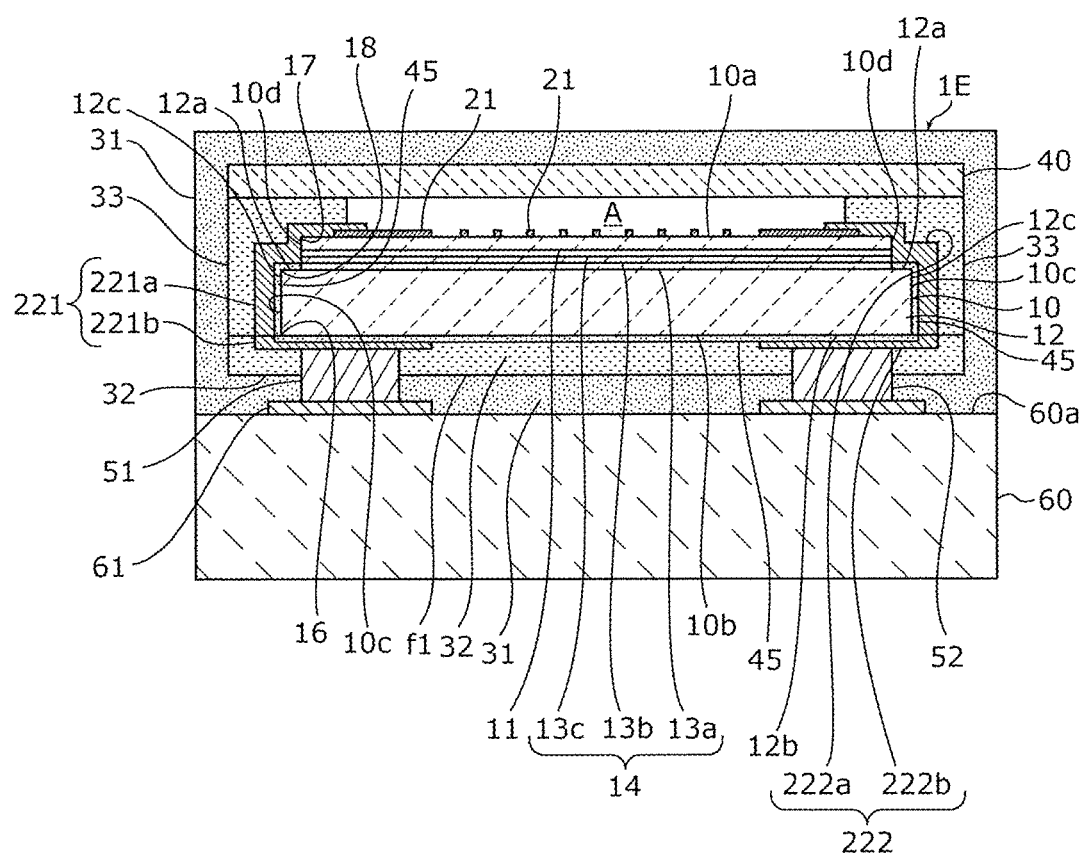
FIG. 12 is a cross-sectional view showing an acoustic wave device according to a fifth modified example of the first preferred embodiment of the present invention.

FIG. 12 is a cross-sectional view showing an acoustic wave device 1E according to a fifth modified example of the first preferred embodiment. In the acoustic wave device 1E according to the fifth modified example, an insulating layer 45 is provided between the one main surface 12a, the other main surface 12b, and side surfaces 12c of the supporting substrate 12 and the first extended wiring line 221, and between the one main surface 12a, the other main surface 12b, and the side surfaces 12c of the supporting substrate 12 and the second extended wiring line 222, which is different from the first preferred embodiment in which the insulating layer 45 is not provided.

The element substrate 10 of the acoustic wave device 1E includes the supporting substrate 12 including a silicon material, the intermediate layer 14 provided on the supporting substrate 12, and the piezoelectric layer 11 provided on the intermediate layer 14.

In the acoustic wave device 1E, the piezoelectric layer 11 and the intermediate layer 14 have a smaller outer shape than the supporting substrate 12 when viewed from a direction perpendicular or substantially perpendicular to the first main surface 10a, and the side surfaces 10d of the piezoelectric layer 11 and the intermediate layer 14 are located on inner sides of the side surfaces 10c of the element substrate 10 when viewed in a cross section. For example, with the side surfaces 10d of the piezoelectric layer 11 and the intermediate layer 14 being provided on inner sides of the side surfaces 10c of the element substrate 10, the piezoelectric layer 11 and the intermediate layer 14 can be prevented from being touched by a dicing blade during the step of cutting the mother substrate into pieces by using the dicing blade (see part (b) of FIG. 7), and cracking or interfacial delamination of the piezoelectric layer 11 and the intermediate layer 14 can be significantly reduced or prevented.

The element substrate 10 having the above-described structure has a protruded shape in the cross section. Specifically, the element substrate 10 includes the first main surface 10a, the second main surface 10b, the side surfaces 10c, and the side surfaces 10d. The side surfaces 10c adjoin the second main surface 10b and are connected to the second main surface 10b. The side surfaces 10d adjoin the first main surface 10a and are connected to the first main surface 10a. The side surfaces 10d of the element substrate 10 herein are the same or substantially the same as the side surfaces 10d of the piezoelectric layer 11 and the intermediate layer 14 described above. The supporting substrate 12 defining the element substrate 10 includes the one main surface 12a, the other main surface 12b, and the side surfaces 12c. The other main surface 12b of the supporting substrate 12 is the same or substantially the same as the second main surface 10b, and the side surfaces 12c of the supporting substrate 12 are the same as the side surfaces 10c. The one main surface 12a of the supporting substrate 12 adjoins both the side surfaces 10d and the side surfaces 10c, and a portion of the one main surface 12a connects the side surfaces 10d and the side surfaces 10c. The side surfaces 10c and 12c may be inclined with respect to the first main surface 10a or the second main surface 10b. The first main surface 10a, the second main surface 10b, and the one main surface 12a need not necessarily be parallel or substantially parallel to each other.

In addition, the element substrate 10 includes the first corner portions 16, which are portions at which the second main surface 10b and the side surfaces 10c adjoin each other, the second corner portions 17, which are portions at which the first main surface 10a and the side surfaces 10d adjoin each other, and third corner portions 18, which are portions at which the one main surface 12a and the side surfaces 10c adjoin each other.

The first extended wiring line 221a and the second extended wiring line 222a are provided along the side surfaces 10d of the piezoelectric layer 11 and the paths that connect the side surfaces 10d of the piezoelectric layer 11 and the side surfaces 10c of the element substrate 10. More specifically, the first extended wiring line 221a and the second extended wiring line 222a are provided stepwise from the first main surface 10a along the second corner portions 17, the side surfaces 10d, the one main surface 12a, the third corner portions 18, and the side surfaces 10c. The first extended wiring line 221a and the second extended wiring line 222a are provided along a surface not provided with the piezoelectric layer 11 or the intermediate layer 14 of the one main surface 12a of the supporting substrate 12. The first extended wiring line 221b and the second extended wiring line 222b are connected to the end portions of the first extended wiring line 221a and the second extended wiring line 222a provided along the side surfaces 10c, respectively, and are provided along the first corner portions 16 and the second main surface 10b. Note that the first extended wiring lines 221a and 221b and the second extended wiring lines 222a and 222b according to the fifth modified example are not in contact with the supporting substrate 12.

In the acoustic wave device 1E according to the fifth modified example, the insulating layer 45 is provided on the one main surface 12a, the other main surface 12b, and the side surfaces 12c of the supporting substrate 12. Specifically, the insulating layer 45 is provided between the one main surface 12a of the supporting substrate 12 and the first and second extended wiring lines 221a and 222a and between the side surfaces 12c and the first and second extended wiring lines 221a and 222a. In addition, the insulating layer 45 is provided between the other main surface 12b of the supporting substrate 12 and the first and second extended wiring lines 221b and 222b. The insulating layer 45 is preferably made of, for example, a material such as silicon oxide ($SiO_2$) or silicon nitride (SiN). The insulating layer 45 may be provided on the entire or substantially the entire one main surface 12a, the entire or substantially the entire other main surface 12b, and the entire or substantially the entire side surfaces 12c.

With the insulating layer 45 being provided between the supporting substrate 12 including a silicon material and the first and second extended wiring lines 221 and 222, the first and second extended wiring lines 221 and 222 are not in contact with the supporting substrate 12. For example, in a case where the supporting substrate 12 including a silicon material is in contact with the first and second extended wiring lines 221 and 222, a leak current is likely to flow into the supporting substrate 12. In contrast, as a result of providing the insulating layer 45 between the supporting substrate 12 and the first and second extended wiring lines 221 and 222 as in the acoustic wave device 1E, flowing of a leak current into the supporting substrate 12 including a silicon material, and it is possible to significantly reduce or prevent degradation of characteristics of the acoustic wave device 1E is able to be significantly reduced or prevented.

The acoustic wave device 1E according to the fifth modified example includes the element substrate 10 that includes the first main surface 10a, the second main surface 10b facing away from the first main surface 10a, and the side surfaces 10c connecting the first main surface 10a and the second main surface 10b and that includes a silicon material at least partially; the functional electrode 21 provided on the first main surface 10a of the element substrate 10; the first extended wiring line 221 and the second extended wiring line 222 that are electrically connected to the functional electrode 21 and to extend from the first main surface 10a to the side surfaces 10c; and the insulating layer 45 provided between the element substrate 10 and the first and second extended wiring lines 221 and 222 on outer sides of the side surfaces 10c. As a result of providing the insulating layer 45 between the side surfaces 10c of the element substrate 10 including a silicon material and the first and second extended wiring lines 221 and 222 as described above, flowing of a leak current into the element substrate 10 is able to be significantly reduced or prevented.

In addition, the first extended wiring line 221 and the second extended wiring line 222 extend from the side surfaces 10c to the second main surface 10b, and the insulating layer 45 is provided between the element substrate 10 and the first and second extended wiring lines 221 and 222 on an outer side of the second main surface 10b. As a result of providing the insulating layer 45 between the second main surface 10b of the element substrate 10 and the first and second extended wiring lines 221 and 222 as described above, flowing of a leak current into the element substrate 10 including a silicon material is able to be significantly reduced or prevented.

In addition, the element substrate 10 includes the supporting substrate 12 that includes the other main surface 12b, which is the same as the second main surface 10b, and the one main surface 12a facing away from the other main surface 12b and that includes a silicon material; and the piezoelectric layer 11 located above the one main surface 12a of the supporting substrate 12. The side surfaces 10d of the piezoelectric layer 11 are located on inner sides of the side surfaces 10c of the element substrate 10. The first extended wiring line 221 and the second extended wiring line 222 are formed along the side surfaces 10d of the piezoelectric layer 11 and the paths that connect the side surfaces 10d of the piezoelectric layer 11 and the side surfaces 10c of the element substrate 10 and that correspond to at least a portion of the one main surface 12a of the supporting substrate 12. The insulating layer 45 is provided between the supporting substrate 12 and the first and second extended wiring lines 221 and 222 on an outer side of the one main surface 12a. As a result of providing the insulating layer 45 between the one main surface 12a of the supporting substrate 12 and the first and second extended wiring lines 221 and 222 as described above, flowing of a leak current into the supporting substrate 12 including a silicone material is able to be significantly reduced or prevented.

In the fifth modified example, the intermediate layer 14 has the following multilayer structure.

The intermediate layer 14 includes the higher-order mode leakage layer 13a, the high-acoustic-velocity film 13b, and the low-acoustic-velocity film 13c. Specifically, the higher-order mode leakage layer 13a, which is made of a film that prevents leakage of a higher-order mode, is laminated on the supporting substrate 12, the high-acoustic-velocity film 13b having a relatively high acoustic velocity is laminated on the higher-order mode leakage layer 13a, the low-acoustic-velocity film 13c having a relatively low acoustic velocity is laminated on the high-acoustic-velocity film 13b, and the piezoelectric layer 11 is laminated on the low-acoustic-velocity film 13c. An appropriate material may be provided between the intermediate layer 14 and the supporting substrate 12.

The higher-order mode leakage layer 13a can be made by using an appropriate material that prevents leakage of a higher-order mode, for example, silicon oxide or the like.

The high-acoustic-velocity film 13b confines an acoustic wave within a portion where the piezoelectric layer 11 and the low-acoustic-velocity film 13c are laminated to prevent the acoustic wave from being leaked below the high-acoustic-velocity film 13b. The high-acoustic-velocity film 13b is preferably made of, for example, aluminum nitride. As long as the acoustic wave can be confined, various high-acoustic-velocity materials may be used, for example, aluminum nitride, aluminum oxide, silicon carbide, silicon nitride, silicon oxynitride, a DLC film or diamond, a medium mainly including any of these materials, or a medium mainly including a mixture of these materials. To confine the acoustic wave within the portion where the piezoelectric layer 11 and the low-acoustic-velocity film 13c are laminated, the high-acoustic-velocity film 13b is preferably, for example, as thick as possible, and preferably, for example, has a thickness that is about 0.1 times or more the wavelength $\lambda$ of the acoustic wave, furthermore, about 1.5 times or more the wavelength $\lambda$ of the acoustic wave.

The low-acoustic-velocity film 13c is preferably made of, for example, silicon oxide. As the material of the low-acoustic-velocity film 13c, an appropriate material having an acoustic velocity of a bulk wave lower than that of a bulk wave that propagates through the piezoelectric layer 11 may be used, for example, silicon oxide, glass, silicon oxynitride, tantalum oxide, and a medium mainly including any of the above materials, for example, a compound provided by adding fluorine, carbon, or boron to silicon oxide.

The high-acoustic-velocity film 13b is a film in which the acoustic velocity of a bulk wave in the high-acoustic-velocity film 13b is higher than that of a surface acoustic wave or a boundary acoustic wave that propagates through the piezoelectric layer 11. The low-acoustic-velocity film 13c is a film in which the acoustic velocity of a bulk wave in the low-acoustic-velocity film 13c is lower than that of a bulk wave that propagates through the piezoelectric layer 11.

With the higher-order mode leakage layer 13a, the high-acoustic-velocity film 13b, and the low-acoustic-velocity film 13c being provided between the piezoelectric layer 11 and the supporting substrate 12, a Q value can be increased.

1-9. Sixth Modified Example of First Preferred Embodiment

Figure 13:
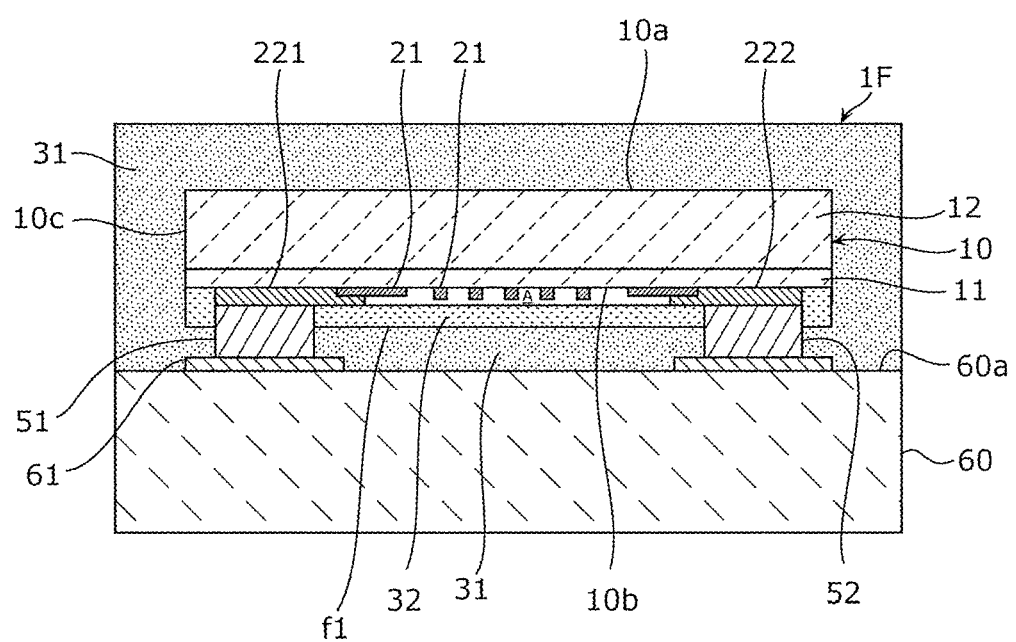
FIG. 13 is a cross-sectional view showing an acoustic wave device according to a sixth modified example of the first preferred embodiment of the present invention.

FIG. 13 is a cross-sectional view showing an acoustic wave device 1F according to a sixth modified example of the first preferred embodiment. In the acoustic wave device 1F shown in FIG. 13, the functional electrode 21, the first extended wiring line 221, and the second extended wiring line 222 are provided on the second main surface 10b of the element substrate 10, which is different from the above-described first preferred embodiment in which the functional electrode 21, the first extended wiring line 221a, and the second extended wiring line 222a are provided on the first main surface 10a. In the acoustic wave device 1F according to the sixth modified example, the first extended wiring line 221 and the second extended wiring line 222 are not provided on the side surfaces 10c of the element substrate 10.

Also in the acoustic wave device 1F according to the sixth modified example, the interface f1 between the first resin portion 31 and the second resin portion 32 is located closer to the mount substrate 60 than the first extended wiring line 221 and the second extended wiring line 222. With this structure, the movement of the metallic substance included in the first extended wiring line 221 and the second extended wiring line 222 along the interface f1 is able to be significantly reduced or prevented. Accordingly, the occurrence of electrochemical migration in the metallic substance included in the first extended wiring line 221 and the second extended wiring line 222 is able to be significantly reduced or prevented.

1-10. Other Modified Examples of First Preferred Embodiment

Figure 14:
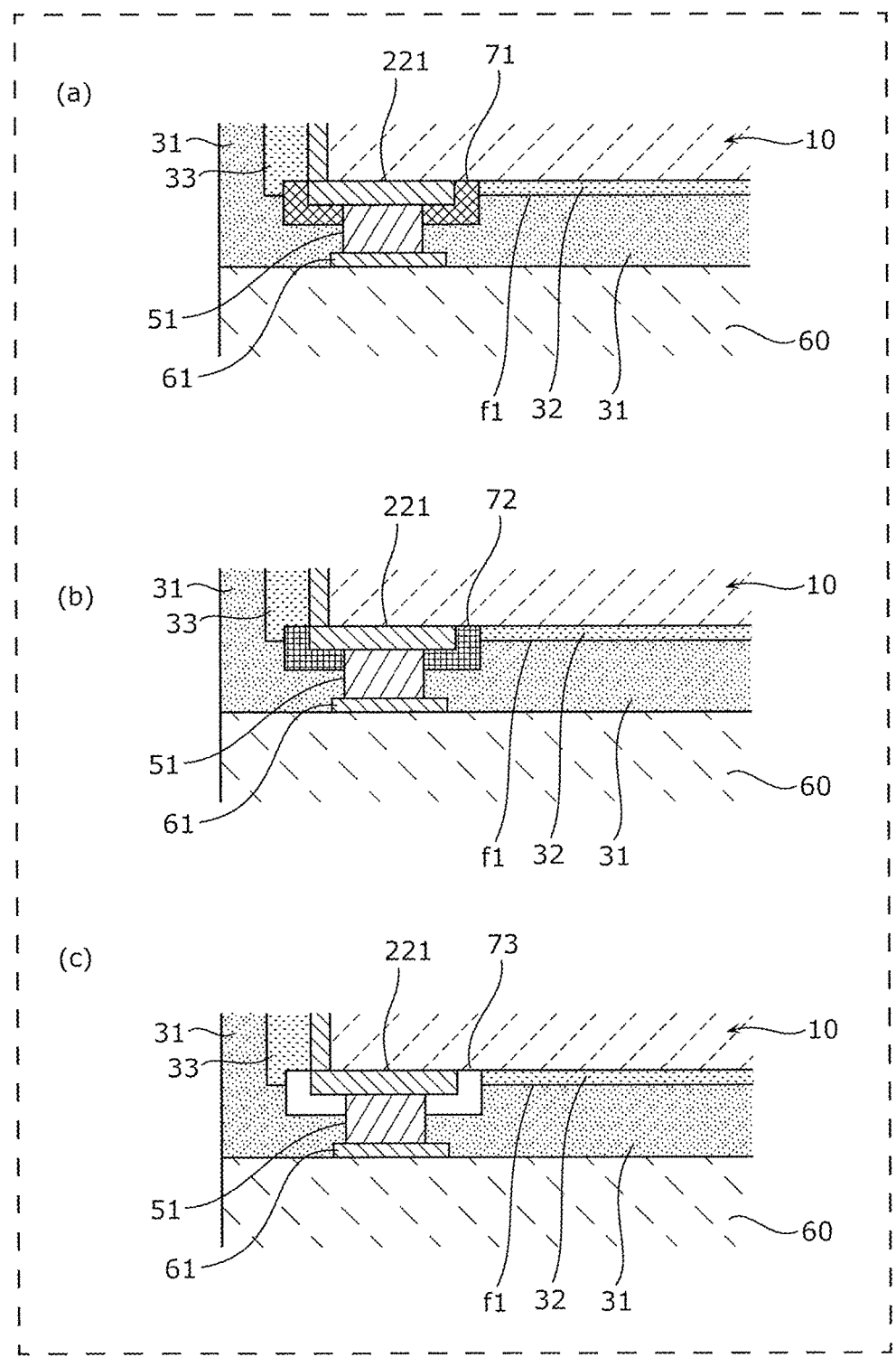
FIG. 14 includes cross-sectional views showing a portion of acoustic wave devices according to other modified examples.

In the first preferred embodiment, the interface f1 at which the first resin portion 31 and the second resin portion 32 are in contact with each other is in contact with the first external terminal 51 and the second external terminal 52, but the preferred embodiments of the present invention are not limited thereto. For example, as shown in part (a) of FIG. 14, the interface f1 may be in contact with a metallic member 71, which is the first external terminal 51 and the second external terminal 52. Alternatively, as shown in part (b) of FIG. 14, the interface f1 may be in contact with an insulating member 72. Alternatively, as shown in part (c) of FIG. 14, the interface f1 may be in contact with a space 73. Also with these structures, the occurrence of electrochemical migration in the metallic substance included in the first extended wiring line 221 and the second extended wiring line 222 is able to be significantly reduced or prevented.

In the first preferred embodiment, the element substrate 10 includes the piezoelectric layer 11 and the supporting substrate 12, but the preferred embodiments of the present invention are not limited thereto. The element substrate 10 may be made of a single object and may include, for example, a piezoelectric ceramic material.

In the first preferred embodiment, the electrode structure on the first main surface 10a of the element substrate 10 is not particularly limited, and the functional electrode 21 need not necessarily include a reflector. It is sufficient that the functional electrode 21 have at least an electrode structure that excites an acoustic wave.

Second Preferred Embodiment

Figure 15:
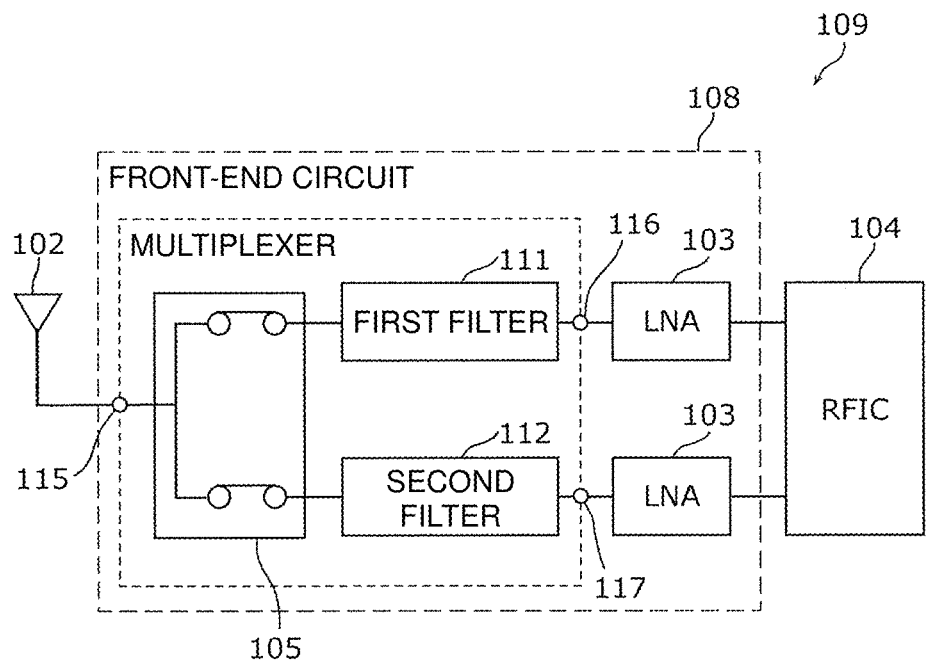
FIG. 15 is a circuit diagram showing a front-end circuit and a communication apparatus according to a second preferred embodiment of the present invention.

Next, a description will be provided of a front-end circuit 108 and a communication apparatus 109 according to a second preferred embodiment of the present invention. FIG. 15 is a circuit diagram showing the front-end circuit 108 and the communication apparatus 109 according to the second preferred embodiment.

In the front-end circuit 108 and the communication apparatus 109, a first filter 111 and a second filter 112 each include the acoustic wave device 1 according to the first preferred embodiment.

In the front-end circuit 108 and the communication apparatus 109 shown in FIG. 15, to amplify a signal input thereto, a low noise amplifier (LNA) 103 is provided between a first terminal 116 and an RFIC 104, and an LNA 103 is provided between a second terminal 117 and the RFIC 104. In addition, to switch the connection state with an antenna element 102, a multi-port switch 105 is provided between the first filter 111 and an antenna common terminal 115 and between the second filter 112 and the antenna common terminal 115. The multi-port switch 105 is a switch that can be turned ON/OFF simultaneously, and connects the second filter 112 to the antenna common terminal 115 when the first filter 111 is connected to the antenna common terminal 115, that is, when the first filter 111 is performing signal processing.

Also in the front-end circuit 108 and the communication apparatus 109 having the above-described circuitry, the occurrence of electrochemical migration in the metallic substance included in the extended wiring lines as in the first preferred embodiment is able to be significantly reduced or prevented.

In the second preferred embodiment, the first filter 111 defines and functions as a reception filter, but the preferred embodiments of the present invention are not limited thereto. The first filter 111 including the acoustic wave device 1 may be used as a transmission filter. For example, the LNA 103 located between the first filter 111 defining and functioning as a transmission filter and the RFIC 104 may be replaced with a power amplifier (PA), and accordingly the communication apparatus 109 that is able to perform transmission and reception can be formed.

Each filter defining the front-end circuit 108 and the communication apparatus 109 is not limited to a surface acoustic wave filter and may be a boundary acoustic wave filter. Also with these features, advantageous effects similar to the advantageous effects of the acoustic wave device 1 according to the above-described preferred embodiments and so forth can be produced.

Other Preferred Embodiments

A description has been given of the acoustic wave devices 1 to 1F, the front-end circuit 108, and the communication apparatus 109 according to the present invention on the basis of the preferred embodiments and modified examples. The present invention is not limited to the above-described preferred embodiments and modified examples. Another preferred embodiment implemented by combining arbitrary components according to the above-described preferred embodiments and modified examples, a modified example provided by applying, to the above-described preferred embodiments, various changes conceived of by a person skilled in the art without deviating from the gist of the present invention, and various apparatuses incorporating an acoustic wave device according to the present invention are included in the present invention.

INDUSTRIAL APPLICABILITY

Acoustic wave device according to preferred embodiments of the present invention are widely used in various electronic apparatuses or communication apparatuses.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
an element substrate that includes a first main surface and a second main surface facing away from each other and that at least partially has piezoelectricity;
a functional electrode that is provided directly or indirectly on the first main surface of the element substrate;
a first extended wiring line and a second extended wiring line that are provided directly or indirectly on the second main surface of the element substrate, that are electrically connected to the functional electrode, and that are adjacent to each other;
a first external terminal that is electrically connected to the first extended wiring line and that is provided directly or indirectly on the second main surface of the element substrate;
a second external terminal that is electrically connected to the second extended wiring line and that is provided directly or indirectly on the second main surface of the element substrate;
a first resin portion that seals the acoustic wave device; and
a second resin portion that is provided at least at a position which is between the element substrate and the first resin portion and which is on the second main surface; wherein
the second resin portion has a lower Young's modulus than the first resin portion;
the first resin portion and the second resin portion are in contact with each other; and
an interface at which the first resin portion and the second resin portion are in contact with each other is located closer to a mount substrate than the first extended wiring line and the second extended wiring line.

2. The acoustic wave device according to claim 1, wherein the interface at which the first resin portion and the second resin portion are in contact with each other is in contact with the first external terminal, the second external terminal, an insulating member, or a space.

3. The acoustic wave device according to claim 2, wherein the first external terminal and the second external terminal include a metallic material having a lower ionization tendency than a metallic material included in the first extended wiring line and the second extended wiring line.

4. The acoustic wave device according to claim 3, wherein the first resin portion and the second resin portion are provided between the first external terminal and the second external terminal.

5. The acoustic wave device according to claim 1, wherein the first extended wiring line and the second extended wiring line include Cu, and the first external terminal and the second external terminal include Sn.

6. The acoustic wave device according to claim 1, wherein the first extended wiring line and the second extended wiring line are not in contact with the first resin portion and are in contact with the second resin portion.

7. The acoustic wave device according to claim 1, wherein the functional electrode includes an IDT electrode.

8. The acoustic wave device according to claim 1, wherein the first extended wiring line and the second extended wiring line extend from the first main surface to side surfaces and the second main surface, the side surfaces connecting the first main surface and the second main surface.

9. The acoustic wave device according to claim 8, further comprising:
a third resin portion that is provided at least between the first resin portion, and the first extended wiring line and the second extended wiring line that are provided on the side surfaces; wherein
the third resin portion has a lower Young's modulus than the first resin portion.

10. The acoustic wave device according to claim 8, further comprising:
a third resin portion that is provided at least between the first resin portion, and the first extended wiring line and the second extended wiring line that are provided on the side surfaces; wherein
the third resin portion has a lower filler content than the first resin portion.

11. The acoustic wave device according to claim 9, wherein
the third resin portion is further provided around the functional electrode in a direction along the first main surface; and
the acoustic wave device further comprises a cover layer that is provided on the third resin portion to cover the functional electrode in a direction perpendicular or substantially perpendicular to the first main surface.

12. The acoustic wave device according to claim 1, wherein
the element substrate includes at least a supporting substrate including a silicon material and a piezoelectric layer that is provided directly or indirectly on the supporting substrate; and
the acoustic wave device further comprises an insulating layer that is provided between the supporting substrate, and the first extended wiring line and the second extended wiring line.

13. The acoustic wave device according to claim 1, wherein
the element substrate includes at least a supporting substrate and a piezoelectric layer that is provided directly or indirectly on the supporting substrate;
when the element substrate is viewed in a cross section from a direction perpendicular or substantially perpendicular to the first main surface, side surfaces of the piezoelectric layer are located on inner sides of the side surfaces of the element substrate; and
the first extended wiring line and the second extended wiring line extend from the first main surface to the side surfaces of the piezoelectric layer and the side surfaces of the element substrate.

14. The acoustic wave device according to claim 1, wherein
the element substrate includes a supporting substrate and a piezoelectric layer that is provided directly on the supporting substrate;
the functional electrode is provided on the piezoelectric layer; and
an acoustic velocity of a bulk wave that propagates through the supporting substrate is higher than an acoustic velocity of an acoustic wave that propagates through the piezoelectric layer.

15. The acoustic wave device according to claim 1, wherein
the element substrate includes a supporting substrate, a piezoelectric layer that is provided indirectly on the supporting substrate, and an intermediate layer that is provided between the supporting substrate and the piezoelectric layer;
the functional electrode is provided on the piezoelectric layer;
an acoustic velocity of a bulk wave that propagates through the intermediate layer is lower than an acoustic velocity of an acoustic wave that propagates through the piezoelectric layer; and
an acoustic velocity of a bulk wave that propagates through the supporting substrate is higher than the acoustic velocity of the acoustic wave that propagates through the piezoelectric layer.

16. The acoustic wave device according to claim 1, wherein
the element substrate includes a supporting substrate, a piezoelectric layer that is provided indirectly on the supporting substrate, and an intermediate layer that is provided between the supporting substrate and the piezoelectric layer;
the functional electrode is provided on the piezoelectric layer;
the intermediate layer includes a low-acoustic-velocity film in which an acoustic velocity of a bulk wave that propagates therethrough is lower than an acoustic velocity of an acoustic wave that propagates through the piezoelectric layer, and a high-acoustic-velocity film in which an acoustic velocity of a bulk wave that propagates therethrough is higher than the acoustic velocity of the acoustic wave that propagates through the piezoelectric layer;
the low-acoustic-velocity film is provided between the piezoelectric layer and the supporting substrate; and
the high-acoustic-velocity film is provided between the low-acoustic-velocity film and the supporting substrate.

17. A front-end circuit comprising:
the acoustic wave device according to claim 1.

18. A communication apparatus comprising:
the front-end circuit according to claim 17; and
a signal processing circuit that processes a high-frequency signal.

19. An acoustic wave device comprising:
an element substrate that includes a first main surface and a second main surface facing away from each other and that at least partially has piezoelectricity;
a functional electrode that is provided on the first main surface of the element substrate;
a first extended wiring line and a second extended wiring line that are provided on the second main surface of the element substrate, that are electrically connected to the functional electrode, and that are adjacent to each other;
a first external terminal that is electrically connected to the first extended wiring line and that is provided directly or indirectly on the second main surface of the element substrate;
a second external terminal that is electrically connected to the second extended wiring line and that is provided directly or indirectly on the second main surface of the element substrate;
a first resin portion that seals the acoustic wave device; and
a second resin portion that is provided at least at a position which is between the element substrate and the first resin portion and which is on the second main surface; wherein the second resin portion has a lower filler content than the first resin portion;
the first resin portion and the second resin portion are in contact with each other; and
an interface at which the first resin portion and the second resin portion are in contact with each other is located closer to a mount substrate than the first extended wiring line and the second extended wiring line.

* * * * *